（12） United States Patent
Takeuchi et al.

(10) Patent No.: US 6,414,510 B1
(45) Date of Patent: Jul. 2, 2002

(54) TESTING APPARATUS AND METHOD OF IC DEVICES

(75) Inventors: Hideyuki Takeuchi; Ichiro Kuwabara, both of Honjyo (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/612,502

(22) Filed: Jul. 7, 2000

(30) Foreign Application Priority Data

Jul. 8, 1999 (JP) ............................................ 11-194225

(51) Int. Cl.⁷ ......................... G01R 31/28; G01R 31/02
(52) U.S. Cl. ..................................... 324/765; 324/158.1
(58) Field of Search ............................. 324/754, 765, 324/158.1; 414/590, 806, 816

(56) References Cited

U.S. PATENT DOCUMENTS 6,062,799 A  *  5/2000  Han et al. .................... 414/416
6,104,183 A  *  8/2000  Kobayashi et al. ......... 324/765

* cited by examiner

Primary Examiner—Ernest Karlsen

(74) *Attorney, Agent, or Firm*—Antonelli, Terry, Stout & Kraus, LLP

(57) ABSTRACT

A testing apparatus of IC devices, comprising: a loader portion (10) for mounting a predetermined number of the IC devices (5) on each of test boards (1) transferred on a horizontal reference plane (H); a pre-heat portion (11) for receiving the test boards transferred on the horizontal plane from the loader portion and so as to bringing the IC devices mounted thereon into a predetermined temperature condition; a testing/measuring portion (12) having test heads (18) and for performing testing/measuring on the IC devices mounted on the test boards; a defroster portion (13) for receiving the test boards transferred from the testing/measuring portion and for bringing the IC devices completed with testing/measuring thereon into other predetermined temperature condition; and an unloader portion (14) for receiving the test boards transferred on the horizontal reference plane (H) from the defroster portion so as to unload the IC devices from the test boards depending on test results obtained in the testing/measuring portion, wherein each of the test boards is constructed to holds the IC devices mounted thereon when it is in a vertical standing condition, and further in the testing/measuring portion is provided a contact/separate means (60) for bringing two (2) of the test boards standing in vertical condition in upper and lower positions with respect to the horizontal reference plane (H), into contact with or separate from the test heads (18), simultaneously.

20 Claims, 12 Drawing Sheets

TESTING APPARATUS AND METHOD OF IC DEVICES

BACKGROUND OF THE INVENTION

1. Field of the Invention

The present invention relates to a testing apparatus and a method for IC devices for performing testing and/or measurement (testing/measuring) on electric properties of the IC devices (integrated circuit elements).

2. Description of Prior Art

An apparatus for performing testing/measuring on the electric properties of the IC devices is, in general, constructed with an IC tester and an IC handler, wherein the IC handler comprises a loader portion, a testing/measuring portion and an unloader portion. In the loader portion, there are provide or prepared a large number of IC devices received within IC device receiving jigs, such as a tray, etc., wherein a predetermined number of the IC devices are moved of mounted onto a test board, which is suitable for performing the testing/measuring by means of an appropriate handling means, and this test board is transferred into the testing/measuring portion. In the testing/measuring portion, there is provided a contact/separate means for contacting and separating the test boards onto a test head of IC devices, as well as for positioning the test board. Thus, the IC devices are connected to sockets of the test head while being mounted on the test board which is transferred into the testing/measuring portion, thereby the testing/measuring of electric properties can be performed through turning or applying the electricity between them. After completing the testing/measuring on the IC devices, the test board is transferred into the unloader portion, thereby being classified into trays depending upon the test results thereof.

For conducting the testing/measuring on the IC devices with efficiency, the large number of the IC devices must be connected to the respective IC testers at the same time, while mounting them on the test board, and it is common that, in the structure of an apparatus for that purpose, there is provide a horizontal convey or transfer passage, on which are positioned the loader portion, the testing/measuring portion and the unloader portion. Namely, after moving and mounting the IC devices to be tested onto the test board in the load portion, this test board is shifted or moved horizontally and sent into the testing/measuring portion, thereby being positioned at a predetermined position so that the IC devices are connected to the test head of the IC tester, and after the completion of the testing, the test board is further shifted or moved until the unloader portion along with the horizontal transfer passage as it is, thereby being performed with unloading operation thereon. Accordingly, the IC tester is positioned at an upper portion or a lower portion of the horizontal transfer passage on which the test board is transferred, and each of the IC devices mounted on this test board is connected to the sockets on the test head by pushing up or pulling down the test board.

However, in positioning of the IC tester and a convey surface of the test board on the horizontal transfer passage in the IC handler up and down in vertical, the size of the apparatus as a whole comes to be large, in particular in the height thereof. In recent years, various package methods and sizes of the IC devices comes to be used in practice, therefore it is common that the testing apparatus of the IC devices is so constructed as to be able to test several kinds or sizes of the IC devices therewith. Accordingly, when conducting the testing on different IC devices, a portion of the apparatus must be re-arranged in the arrangement thereof. With the IC tester, a portion of the members of an interface in a test head must be exchanged, therefore the work of exchanging or re-arrangement of the test head becomes to be difficult. In particular, since the members to be exchanged or re-arranged are considerable heavy things, therefore the higher the position of the IC tester, the more difficult the work in exchanging the arrangement and/or program. Also, if the convey or transfer surface of the test board is positioned in the upper portion of the IC tester, the lower side of the test board must be contact with the test head of the IC tester. Therefore, it is impossible to contact with the leads of the IC devices directly, therefore the test board becomes complicated in the structure thereof, i.e., the electrodes must be provided in the test board for the connection with the contact portions of the test head. Also, it can be considered that the test board is reversed so as to be connected with the test head, then however, there would be a difficulty in the workings, such as loading and unloading of the IC devices, i.e., the work of setting the tray in which the IC devices to be tested are received into the loader portion, and the work of taking out the tray in which the tested IC devices are received into in the unloader portion become difficult.

By taking the aspects mentioned above into the consideration, for example, in Japanese Patent Laying-Open No. Hei 9-152466 (1997), there is disclosed the structure, wherein the test board is transferred under vertically standing condition not only up to the testing/measuring portion, but also to be carried out from the testing/measuring portion. Accordingly, the contacting/separating of the test board with the test head of the IC tester can be conducted while keeping the test board under the vertical standing condition thereof. With such the structure, it is possible to provide the IC tester and the test board at the positions being substantially same to each other in the height thereof. Herein, in the testing apparatus according to this conventional technology, relating to the fact that the IC devices are tested under the condition of a predetermined temperature, a pre-heat portion is provided at the front stage of the testing/measuring portion, in which all IC devices mounted on the test board are heated or cooled so as to be brought at a preset temperature, while at the rear stage of the testing/measuring portion is provided a defroster portion, in which the temperature of the IC devices and the test board is turned back to the condition, being near to the temperature of the air outside. Constructing them in such the manner as mentioned above, it is possible to perform easily, the work of exchanging the arrangement, in particular in a case where the different kinds of IC devices are tested with the apparatus, and the work of setting in and taking out the trays, further maintenance works for the apparatus as a whole.

Here, in the loader portion, the IC devices to be tested must be moved and/or mounted from the tray or the like onto the test board, while in the unloader portion, the IC devices completed with testing must be moved or taken out from the test board onto the tray or the like. This work, in general, is performed by a handling means which sucks the IC device at a package portion thereof with a vacuum, therefore the test board must lies in the horizontal condition. Therefore, in the known testing apparatus mentioned in the above, the loader and unloader portions are positioned on the upper position of the vertical transfer passage for the test boards, wherein this test board is turned from the horizontal lying condition into the vertical standing condition within the stage before it is transferred from the loader portion into the pre-heat portion, so as to reverse the position thereof, while it is turned from the vertical condition back to the horizontal condition after being carried out from the defroster portion. Also, the transfer passages for transferring the test board under the vertical standing condition, i.e., starting from the re-heat portion through the testing/measuring portion where the test board is connected with or separated from the test head of the IC tester and reaching to the defroster portion, is formed or provided on a straight line.

SUMMARY OF THE INVENTION

By the way, requirements for conducting the testing on the IC devices more quickly and more effectively becomes stronger in recent years, though it is desirable in the construction thereof, for that purpose, so that plural test broads, for example, two (2) test boards can be positioned, so as to be connected with or separated from the test heads, simultaneously, however, the conventional art mentioned above shows only the construction in which only one test board is connected to the test heads, i.e., it fails to show anything about the construction for connecting or separating the plural test boards, to or from the test heads. In this conventional art, the transfer passages, through which the test board is transferred under the vertical standing condition from the pre-heat portion through the testing/measuring portion until reaching to the defroster portion, are formed in straight-like form, therefore when trying to make the plural test boards in contact with or separate from the test head, simultaneously, the test boards must be disposed aligning horizontally, so as to be connected with or separated from the test heads. Further, since it is necessary to providing means for transferring the test boards between them, etc., the total construction of the apparatus comes to be long-sized in the horizontal direction, as well as, a thermostatic chamber must be provided until the testing/measuring portion, including the pre-heat portion, therefore there is a problem that it is difficult to perform the controlling of temperature with accuracy.

An object according to the present invention is, for dissolving the above problems, to provide a testing apparatus and a method thereof, with which a small and compact-sizing of the apparatus can be achieved, but is two (2) test boards can be connected with or separated from the test heads, simultaneously, while being standing vertically, thereby obtaining the testing/measuring of electric property on each of the IC devices mounted on each of the test boards, smoothly and quickly.

For accomplishing the object mentioned in the above, in accordance with the present invention, there is provided a testing apparatus of IC devices, comprising a loader portion, a pre-heat portion, a testing/measuring portion, a defroster portion, and an unloader portion, wherein after being transferred from the loader portion to the pre-heat portion so as to bring the IC devices under a condition of a predetermined temperature, test boards, on each of which are mounted a predetermined number of IC devices, are transferred into the testing/measuring portion, so as to be conducted with testing/measuring of electric properties on the IC devices mounted thereon by connecting them to test heads, and thereafter are transferred through the defroster portion into the unloader portion, wherein said loader portion and said unloader portion hold said test board lying horizontally on an almost equal horizontal plane, while providing a vertical transferring means for transferring said test board under a condition of standing vertically, in said pre-heat portion, said testing/measuring portion and said defroster portion, and further positioning said pre-heat portion in an upper position and said defroster portion in a lower position, upon a basis of said horizontal plane, and in said testing/measuring portion is provided a contact/separate means for connecting two of the test boards onto said test heads, respectively, after positioning them in the upper position and the lower position of said horizontal plane.

Herein, on said test board are provided a predetermined number of mounting portions on which the IC devices are mounted, being aligned vertically and horizontally, and in each of those mounting portions is provided a clamp member for clamping the IC device under condition of able to be opened or closed. With this, the IC devices are held under the condition of being positioned with stability, therefore will not moved recklessly even when the test board is changed into the vertical standing condition. In a transit portion from said loader portion to said pre-heat portion is provided a first board reverse means for reversing said test board from the horizontal condition into the vertical condition directing downward, since the pre-heat portion is located in the upper portion than the horizontal plane, it is preferable to achieve the reverse of the test boards in a lower portion of the pre-heat portion. And, the test board being in the vertical condition by this first board reverse means is pushed up to the position as high as said pre-heat portion, by a push-up means for pushing. While in a transit portion from said defroster portion to said unloader portion, since the unloader portion is located below the horizontal plane, there is provided a second board reverse means for reversing said test board from the vertical condition into the horizontal condition at the position as high as said horizontal plane or in vicinity thereof, around an upper position thereof.

Further, according to the present invention, the contact/separate means comprises a board disposition unit for positioning said test boards into two stages locating up and down, and a pusher unit for connecting this board disposition unit to said test heads. The board disposition unit has at least a holder frame which can be shifted into a direction being close to or separate from said test heads, and this holder frame comprises a first and second test board disposition portions located up and down, further an inlet for the test board is provided at one side portion while an exit for the test board at other side portion at a lower position thereof, and a transfer passage for the test board is formed from the first test board disposition portion to the second test board disposition portion. With such the structure, said first and second test board disposition portions can be formed on a surface opposite to that of said holder frame facing to said test heads. And, in each of said first and second test board disposition portions of this holder frame is formed an opening for exposing a portion of said test board, where the IC devices are mounted on, and further in each test board disposition portion are provided guide members for guiding the test board at a lower end portion and a side portion thereof and a positioning means made of a positioning pin which can be engaged with the test board, while in said test board is formed a positioning hole into which the positioning pin can be inserted. Further, a guide member for guiding said test board in said first test board disposition portion is provided in said transfer passage, and the guide member can be opened or closed in front of the passage from said first test board disposition portion to said second test board disposition portion. The holder frame, though being able at least to move in the direction that it comes close to or separate from the test heads, as was mentioned previously, it is also possible to be constructed shift in horizontal direction by a distance of pitch in positioning the IC devices which are mounted on said test board. On the other hand, the pusher unit comprises a pusher base, which is disposed on a side opposite to that facing to said test heads in said holder frame, and pushers being supported on the pusher base and for pushing each of the test boards, which are positioned in said first and second test board disposition portions, toward said test heads, individually.

Also, according to the present invention, there is further provided a testing apparatus of IC devices, comprising: a loader portion for mounting a predetermined number of the IC devices on each of test boards transferred on a horizontal reference plane; a pre-heat portion for receiving the test boards transferred on said horizontal plane from said loader portion and so as to bringing the IC devices mounted thereon into a predetermined temperature condition; a testing/measuring portion having test heads and for performing testing/measuring on the IC devices mounted on the test boards; a defroster portion for receiving the test boards transferred from said testing/measuring portion and for bringing the IC devices completed with testing/measuring thereon into other predetermined temperature condition; and an unloader portion for receiving the test boards transferred on said horizontal reference plane from said defroster portion so as to unload the IC devices from the test boards depending on test results obtained in said testing/measuring portion, wherein each of said test boards is constructed to holds the IC devices mounted thereon when it is in a vertical standing condition, and further in said testing/measuring portion is provided a contact/separate means for bringing two (2) of said test boards standing in vertical condition in upper and lower positions with respect to said horizontal reference plane, into contact with or separate from said test heads, simultaneously.

Further, according to the present invention, in the testing apparatus of IC devices as mentioned in the above, wherein said pre-heat portion is located in the upper position with respect to the horizontal reference plane, and wherein said pre-heat portion includes a transit passage from said loader portion, in which said test boards are change from the horizontal position into the vertical position, by virtue of gravity of weight of said test boards, and further wherein in said testing/measuring portion is provided a mechanism for bringing the test board standing in vertical condition, which is transferred from said pre-heat portion, into the lower portion with respect to said horizontal reference plane, by virtue of gravity of weight of said test board.

Moreover, according to the present invention, in the testing apparatus of IC devices mentioned in the above, wherein said defroster portion is located in the lower position with respect to the horizontal reference plane, and wherein said defroster portion includes a transit passage to said unloader portion, in which said test boards are change from the vertical position into the horizontal position on said the horizontal reference plane. Further, in the above, said test boards are circulated starting from said loader portion, passing through said testing/measuring portion, said defroster portion and said unloader portion, and turned back to said loader portion again.

And, according to the present invention, there is also provided a testing method of IC devices, comprising the following steps of: loading a predetermined number of the IC devices on each of test boards transferred on a horizontal reference plane; pre-heating the test boards being transferred on said horizontal plane from the above step so as to bringing the IC devices mounted thereon into a predetermined temperature condition; testing/measuring electric properties of the IC devices mounted on the test boards, with standing at least two (2) of the test boards in vertical position in upper and lower positions with respect to the horizontal reference plane and bringing them in contact with test heads, simultaneously; defrosting the test boards transferred from said above step for bringing the IC devices completed with testing/measuring thereon into other predetermined temperature condition; and unloading the IC devices from the test boards transferred on said horizontal reference plane from said above step, depending on test results obtained in said testing/measuring step.

In the testing method of IC devices, as mentioned in the above, according to the present invention, wherein the test boars on which the IC devices are mounted are brought into the vertical standing condition when they are transfer into the step of said pre-heating, and are transferred into the step of said testing/measuring in the vertical standing condition thereof. Further, according to the present invention, in step of said testing/measuring, the test boar is moved downward into the lower position with respect to said horizontal reference plane by virtue of gravity of weight of said test board. And, also according to the present invention, the test boards are changed from the vertical standing position into the horizontal position when they are transferred into the step of said unloading after being completed with the step of said defrosting.

DETAILED DESCRIPTION OF PREFERRED EMBODIMENT(S)

Figure 1:
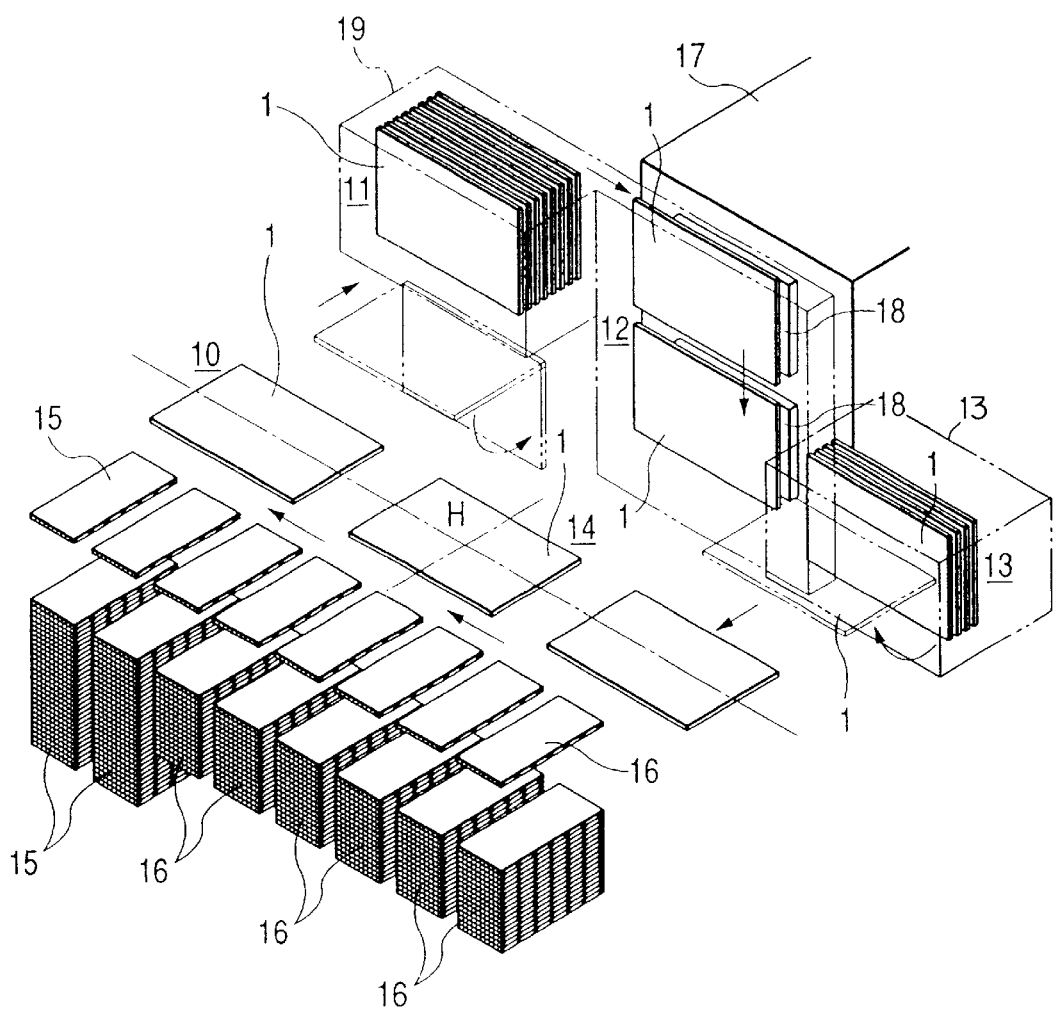
FIG. 1 is an entire view for showing the structure of a testing apparatus of IC devices.
Figure 2:
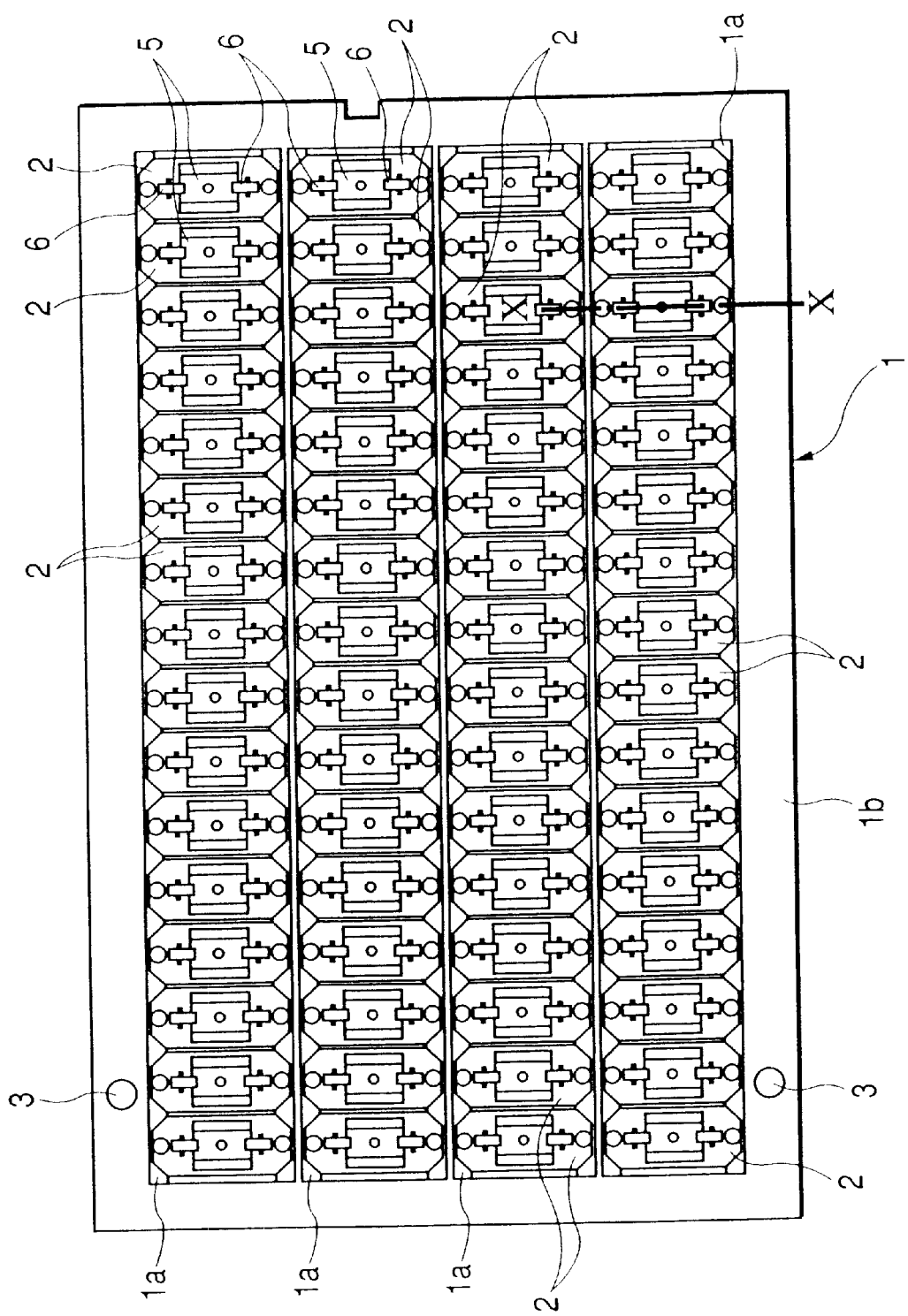
FIG. 2 is a plan view of a test board.
Figure 3:
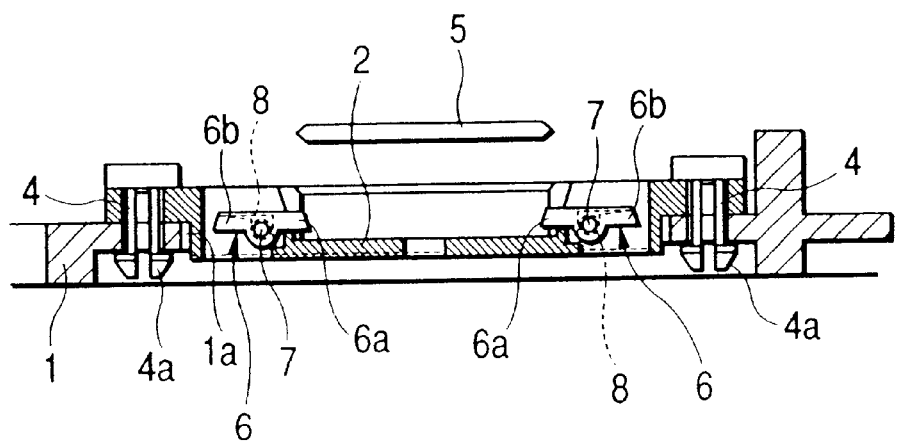
FIG. 3 is a X—X cross-section view in the FIG. 2.

Hereinafter, embodiments according to the present invention will be fully explained by referring to the attached drawings. First, FIG. 1 shows an entire view of the structure of a testing apparatus of IC devices, and FIGS. 2 and 3 show an example of a test board for transferring IC devices in this testing apparatus. Therefore, in the FIG. 2, a reference numeral 1 indicates test boards, on each of which are formed a large number (e.g., in the example shown in the FIG. 2, 4×16=64) of openings 1a for use in providing sockets 2 therein, being aligned in four (4) lines. Also, a periphery of this test board 1 forms an outer peripheral frame 1b, and in the outer peripheral frame 1b are dug or opened positioning holes 3 and 3 at two (2) positions located in an upper portion and a lower potion thereof, respectively, penetrating through in the direction of the plate thickness thereof. The socket 2 is, as shown in the FIG. 3, supported with support shafts 4 and 4, which are provided in the openings 1a for use in providing sockets, and on each of the support shafts 4 is provided a stopper portion 4a, therefore the socket 2 is movable by a little bit of distance in the direction of plate thickness of the test board 1, i.e., between the position where the socket 2 abuts on the surface of the test board 1 and the position where it abuts onto the stopper portion 4a.

In the socket, being omitting in the figure, a positioning wall is provided for positioning a IC device 5 (hereinafter, only by a "device 5"), and also are provided clamp members 6 for clamping the device on the package portion thereof at two (2) positions, wherein each of the clamp members 6 is supported rotatable around a shaft 7. Each of the clamp members 6 comprises a device hold portion 6a and a push-move portion 6b for release, i.e., the latter being pushed to be moved in a direction of separating the device hold portion 6a from the device 5, and in this clamp members 6, the position between the device hold portion 6a and the push-move portion 6b for release is supported on the shaft 7 cradling up and down. And, upon the clamp member 6 is provided a spring 8 to act thereon, thereby biasing the device hold portion 6a into such a direction that it clamps the device 5, by means of the spring 8. Accordingly, when the devices 5 are clamped with the clamp members 6 once, the devices 5 are held with stability at the respective predetermined positions on the test board 1, without shifting in position thereof, when the test board 1 is brought into standing vertically or when it is reversed on the surfaces upside down.

Herein, the test boards 1 are transferred or conveyed within the testing apparatus under the condition of positioning or mounting the large number of devices 5 at the predetermined positions thereon, when testing the devices 5 on the electrical properties thereof, and it also constructs a carrier means for the devices for achieving a function of connecting or separating the devices with or from test heads of an IC tester. While, outside this apparatus, the devices 5 are disposed on predetermined jigs in a condition of being aligned. In general, for such the jig is used a tray being made from a plate-like member, on which are formed recess portions for receiving the devices 5 therein, with a short pitch distance in the vertical and horizontal directions thereof. Herein, the tray is one only for receiving therein the number of the devices under the condition aligning them on it as large the number as possible, and the devices 5 are not positioned in particular position in the recess portions, then in this aspect, it is a member being different from the test board 1 that is constructed to hold the devices 5 under the condition of positioning them with accuracy by means of the above-mentioned clamp members 6.

The testing apparatus, for performing testing/measuring of the devices 5 mounted on the test boards 1, each having the structure mentioned above, on the electric properties thereof, has the structure as shown in the FIG. 1. In the same figure, a reference numeral 10 indicates a loader portion, 11 a pre-heat portion, 12 a testing/measuring portion, 13 a defroster portion, and 14 an unloader portion. In the loader portion 10 are positioned the trays 15, on each of which are mounted the large number of devices to be tested, under the condition that they are piled up in a plural lines thereof, and the devices 5 are taken out from those trays 15 to be mounted onto each of the socket 2 on the test board 1. Also, in the unloader portion 14, the devices 5 being completed with the testing thereon are taken out from the test boards 1, and are transferred to the trays 16 under the condition of being classified upon the basis of the test results thereof in the unloader portion 14 are provided the trays for receiving the devices of 5 of good or qualified products and other trays for receiving the devices of 5 of bad or unqualified products, and further may be provide trays for receiving the devices to be tested again, depending upon the necessity, thereby enabling to divide the qualified products into plural classes thereof. And, the trays 15 which are provided in the loader portion and the trays 16 which are provided in the unloader portion 14 may be ones which are different in the structure by themselves, or ones which are same to each other. Summing up, in the loader portion 10 are set the trays in which the devices 5 are received in advance, while in the unloader portion 14 are set the empty trays.

Herein, in the testing apparatus of the IC devices mentioned in the above, the devices 5 are brought into a condition of predetermined temperature, to be performed with the testing/measuring on the electric properties thereof. For that purposes, the pre-heat portion 11 and the testing/measuring portion 12 are provided within a thermostatic chamber 19. This thermostatic chamber 19 is able to heat the devices 5 up to 100 ° C. or higher than that, or cool them down to −50° C. or lower than that, for example, so as to test or check them under the condition of predetermined temperature. Further, even in a middle range of temperature lying between them, it is possible to test all of the devices 5 under the condition of temperature being substantially same, by controlling the temperature with aid of the thermostatic chamber. Also, the defroster portion 13 is a chamber wherein the temperature is maintained in the middle between the testing temperature and the open air temperature.

The test boards 1 having such the structure as mentioned above, in this testing apparatus, construct or form a means for transferring the devices 5, wherein those test boards 1 are transferred, as is indicated by arrows, from the loader portion 10 via the pre-heat portion 11, the testing/measuring portion 12 and the defroster portion 13, to the unloader portion 14, and then are returned back to the loader portion 10 again, after completion of unloading operation in the unloader portion 14. Thus, the test boards 1 circulate within the apparatus. Also, the postures or positions of the test boards 1 are in the condition of lying horizontal in the loader portion 10 and the unloader portion 14, contrary to this, they are transferred under the condition of standing vertically during an interval when starting from the pre-heat portion 11 passing through the testing/measuring portion 12 and reaching to the defroster portion 13. In the loader portion 10 for performing the loading operation, i.e., transferring or mounting the devices 5 from the trays 15 onto the test boards 1, and in the unloader portion 14 for performing the unloading operation, i.e., classifying the devices 5 after completion of the testing/measuring thereof and storing them onto the tray 16, the test boards 1 are disposed at the position, being roughly equal to one another in the height. Assuming that a horizontal plane, on which the test board lies when the loading and the unloading operations are conducted, is H, the pre-heat portion 11 is located above this horizontal plane H, while the defroster portion 13 below this horizontal plane H. Also, in the testing/measuring portion 12, two (2) pieces of the test boards 1 and 1 are brought to contact (or connect) with or separated from the test heads 18 of the IC tester 17, simultaneously, i.e., those two (2) pieces of the test boards 1 and 1 are disposed up and down, putting the horizontal plane H therebetween.

From the above, with the loci of transfer of the test boards 1' they are held under the horizontal condition at the position being equal to the height of the horizontal plane H in the loader portion 10, and when being transferred into the pre-heat portion 11, they are at the position being higher than the horizontal plane H after they are changed into the vertical standing condition. After being transferred into the testing/measuring portion 12, they are descended from the upper position of the horizontal plane H down to the lower position thereof, and further they are held at the position lower than the horizontal plane H, to be shifted into the defroster portion 13. And, when being shifted from this defroster portion 13 into the unloader portion 14, they are changed in the posture thereof from the vertical position into the horizontal one, and at the same time, are returned back to the position as height roughly equal as the horizontal plane H.

Figure 4:
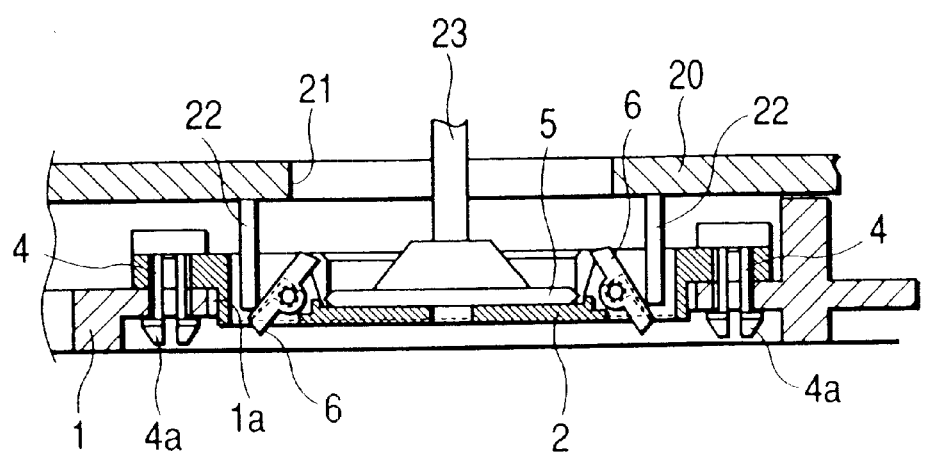
FIG. 4 is an outline view of the structure of a transfer mechanism for the IC devices.

In the loader portion 10, the devices 5 are taken out from the tray(s) 15 and are transferred onto the sockets 2 of the test board 1. The structure of the transfer means for those devices 5 is shown in FIG. 4. In the same figure, a reference numeral 20 indicates a plate member 20 for use in clamp release, and this clamp release plate member 20 is made from a plate member having the sizes being almost equal to the test board 1 or being larger than that, wherein openings 21 for inserting the device, being larger than the external form of the device, are formed at the positions corresponding to the each of the sockets 2 on the test board 1, and also pushing rods 22 are provided vertically at the positions corresponding to each of the push-move portion 6b for release in the clamp member 6 for clamping the devices 5 therewith. Accordingly, this clamp releasing plate member 20 is descended from the upper position thereof when the test board 1 is disposed at a predetermined position in the loader portion 10, so that the release pushing portions 6b of the clamp members 6 is pushed down in the direction against the springs 8 by means of pushing rods 22, thereby releasing the clamp members 6 so as to mount the devices 5 onto the sockets 2 from the device insertion openings 21. Taking out the devices 5 from the tray 15 to transfer them onto the test board 1 is performed by means of a vacuum suction means 23, and this vacuum suction means 23 is driven by, such as a robot or the like, but not shown in the figure, i.e., the device(s) 5 is/are taken out one by one or by a several thereof from the tray 15 at the same time, and are transferred onto the sockets 2. This is the loading operation, and the clamp releasing plate member 20 is risen up when the devices 5 are transferred onto all of the sockets in the test board 1. As a result of loosing the acting force upon the clamp members 6 with this operation, the device hold portions 6a abut on the surfaces of the devices 5 by means of the biasing force of the springs 8, thereby fixing the devices 5 under-the condition of positioning them at the predetermined positions. Under this condition, each the device 5 is held fixedly by the positioning wall not shown in the figure, which is provided on the socket 2 and the clamp member 6, therefore the device 5 will not be shifted in position if the test board stands in the vertical position.

In the loader portion 10, the test board 1 is carried into the pre-heat portion 11 within the thermostatic chamber 19 when the loading operation is completed onto the test board 1. Herein, the test board 1 is held under the horizontal condition in the loader portion 10, but is held under the vertical condition in the pre-heat portion 11, therefore the test board 1 is changed in the posture or position thereof, from the horizontal condition to the vertical condition when it is transferred from the loader portion 10 to the pre-heat portion 11. For transferring the test board 1 which was transferred in this manner into the pre-heat portion 11 under the vertical standing condition thereof, there is provided a transfer mechanism 30 between the loader portion and the pre-heat portion (hereinafter, an inter-loader portion and pre-heat portion transfer mechanism) Then, this inter-loader portion and pre-heat portion transfer mechanism 30 is shown in FIGS. 5 and 6.

Figure 5:
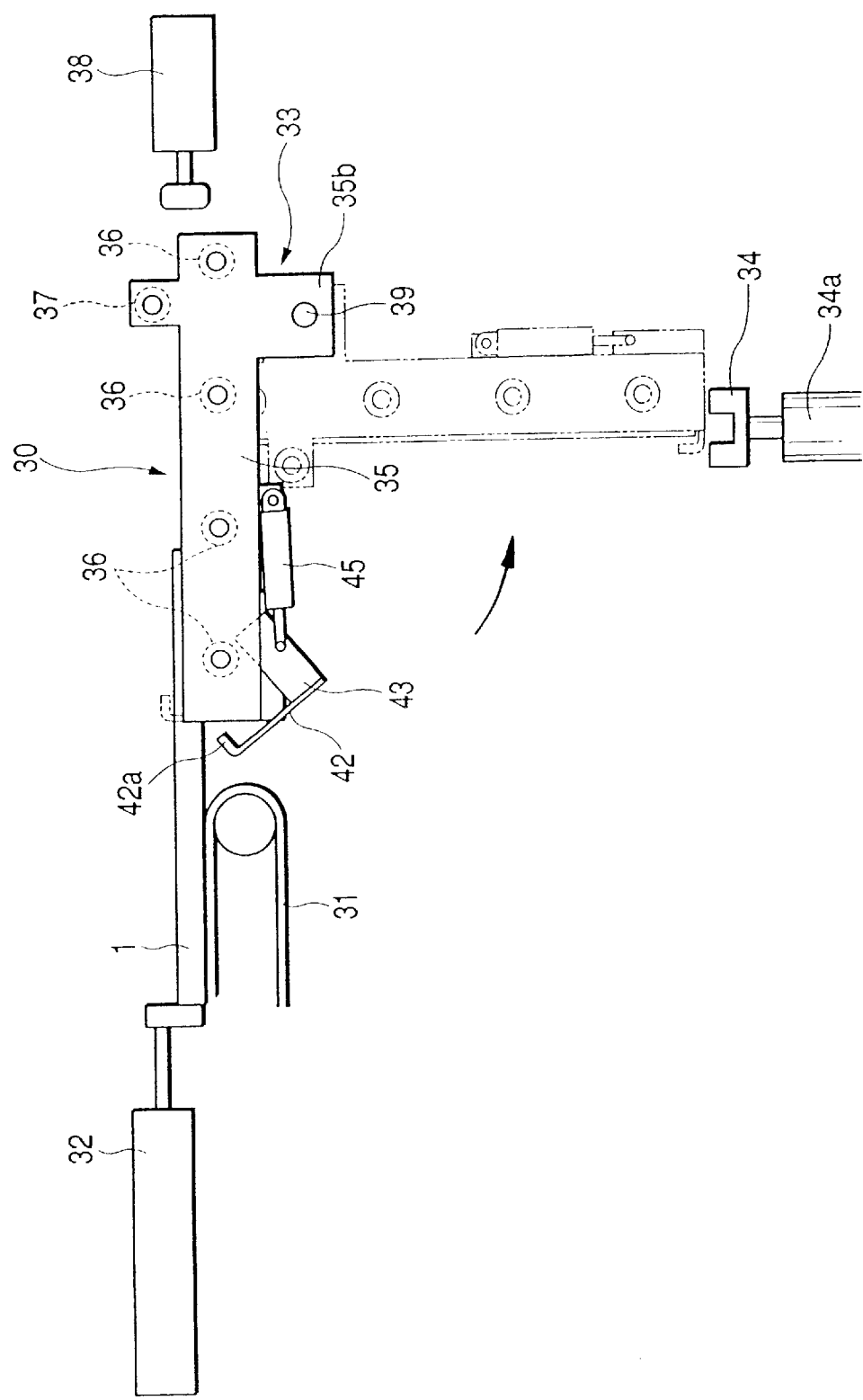
FIG. 5 is an explanatory view of the structure of a transfer means from a loader portion to a pre-heat portion.

In the FIG. 5, a reference numeral 31 indicates a horizontal transfer belt, 32 a push cylinder, 33 a first test board reversing means, and 34 a lifter. The horizontal transfer belt 31 is a transfer means for carrying the test boards 1 out from the loader portion 10, and the test boards 1 which were carried out by this horizontal transfer belt 31 are received within the first test board reversing means 33, further by means of the push cylinder 32.

Figure 6:
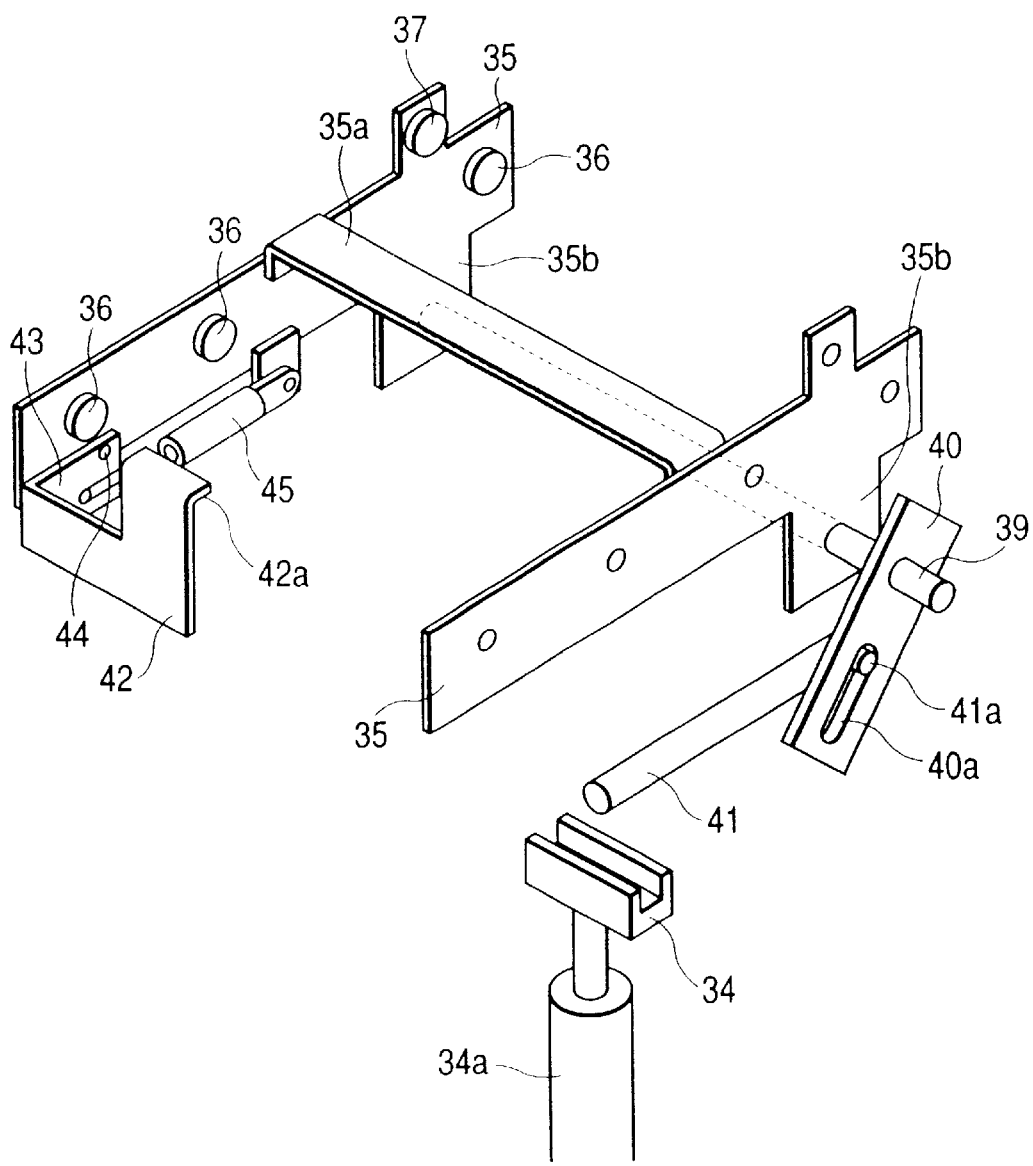
FIG. 6 is a perspective view for showing the structure of a first reverse means for reversing the test board.

The first test board reversing means 33 has, as shown in the FIG. 6, support plate members 35 and 35 at both sides, and those both support plates 35 and 35 are held by a bridge member 35a, so that the distance between them can be kept constant. On the both support plates 35 and 35 are provided a plural number of receiver rollers 36 in a manner of being rotatable and opposing to each other, and those receiver rollers 36 are provided aligning on a plane, roughly on the same surface or plane to the transfer surface on the horizontal transfer belt 31. Also, at the upper position separating from the receiver rollers 36 by a distance, being larger than the size in thickness of the test board 1 a little bit, there are rotatably provided fall-down protector rollers 37. When the test board 1 is pushed up by the push cylinder 32 into the first test board reversing means 33, this test board 1 is received by the receiver rollers 36, on the side surfaces of the outer periphery frame portion 1b at both sides thereof. Also, in a front position in the direction of sending or transferring the test board 1 in the first test board reversing means 33, there are positioned stopper cylinders 38 for protecting from over-run thereof, while opposing to each other, therefore the test board 1 is held so that it does not jump out the first reversing means 33.

With the support plates 35 on left-hand and right-hand sides in the first test board reversing means 33 are provide extension portions 35b, continuously, and on those extension portions 35b and 35b are connected with reverse shafts 39, respectively. On each the reverse shaft 39 is attached an operation plate 40, and a longitudinal opening 40a is dug or opened in the operation plate 40, so as to be engaged with a drive pin 41a provided at a tip of a pushing rod 41 on the long opening 40a, thereby the first test board reversing means 33 is reversed or turned into the vertical position, as is indicated by imaginary lines in the same figure, when this pushing rod 41 is rotated in the direction of an arrow in the FIG. 5. As a result of this, the test board 1 received in the first test board reversing means 33 is changed in the posture or position thereof from the horizontal condition into the vertical position.

Herein, the first test board reversing means 33 must be opened on a reception side thereof when it tries to receives the test board 1 therein. And, the reception side is turned downward when it is reversed or changed in the position, then the test board 1 will fall down in this instance if it is kept under the opening condition. For this reason, the first test board reversing means 33 comprises a shutter plate 42 which can be opened/closed freely on the reception side. The tip of the shutter 42 comes to be a bent portion 42a being bent at an angle 90°, and this shutter plate 42 is connected with a plate-like lever 43. The lever 43 is supported, in the middle position thereof, on one side of the support plates 35, by means of a shaft support portion 44 in a jolting manner, while at the other end thereof is connected with a cylinder 45 for driving. Accordingly, by operating the cylinder 45 for driving, the position of the shutter plate 42 can be changed into a condition where the first test board reversing means 33 opens the receipt side thereof, so as to receive the test board 1 thereon (i.e., the condition indicated by the solid lines in the FIG. 5), and into an operating condition where it closes the receipt side, so as to prevent the test board 1 received therein from falling down (i.e., the condition indicated by imaginary lines in the FIG. 5) . With this, the test board 1 within the first test board reversing means 33 is supported by the receiver roller 36 on one side surface, while by the fall-down protector roller 37 on the other side surface thereof, which is provided at the position separated by a distance being wider a little bit than the thickness of the test board 1 from the receiver roller 36, and is further supported by the shutter plate 42 on the lower surface thereof. Moreover, since the shutter plate 42 is formed with the bent portion 42a turning round to the side surface abutting on the fall-down protector roller 37, the test board 1 is held in the vertical condition with certainty.

Furthermore, for protecting from interference with the test board 1 received when the shutter plate 42 is shifted in position thereof into the operation condition after receipt of the test board 1, the position where the test board 1 is stopped by abutting on the stopper cylinder 38 is set at a position in front of the moving locus of the shutter plate 2. Also, the stopper cylinder 38 is contracted when the first test board reversing means 33 is reversed, thereby enabling to perform the reversing operation without any trouble.

When the test board 1 is turned over into the vertical standing condition by means of the first test board reversing means 33, it is located below the horizontal plane H. While, the pre-heat portion 11 within the thermostatic chamber 19 is located above the horizontal plane H, then, the test board 1 is pushed up to the position of the pre-heat portion 11. This operation is accomplished by lifter 34. The lifter 34 is connected to the rod of a pusher cylinder 34a, and the test board 1 is led out from the first test board reversing means 33 by extending this pusher cylinder 34a, to be moved into the pre-heat portion 11 Further, the lifter 34 abuts on the test board 1 at the position different from where the shutter plate 42 abuts thereon. Also, in the thermostatic chamber 19 in which the pre-heat portion 11 is provided, though not shown in the figure, an opening is formed therein, being at the minimum but necessary for receiving the test board 1 therein, and this opening can be opened or closed by a shutter or the like.

The pre-heat portion 11 is an apparatus for receiving a predetermined number of the test boards 1 therein so as to heat up or cool down the devices mounted thereon to the preset temperature. Accordingly, the test boards 1 which are transferred into by the lifter 34 in the inter-loader portion and pre-heat portion shift mechanism 30 at a predetermined timing. Thus, the pre-heat portion 11 comprises a receiving means 46 for the test board 1 and a pitch transfer means 47 for the test board 1. Then, explanation will be given on the concrete constructions of those, by referring to FIGS. 7 and 8.

Figure 7:
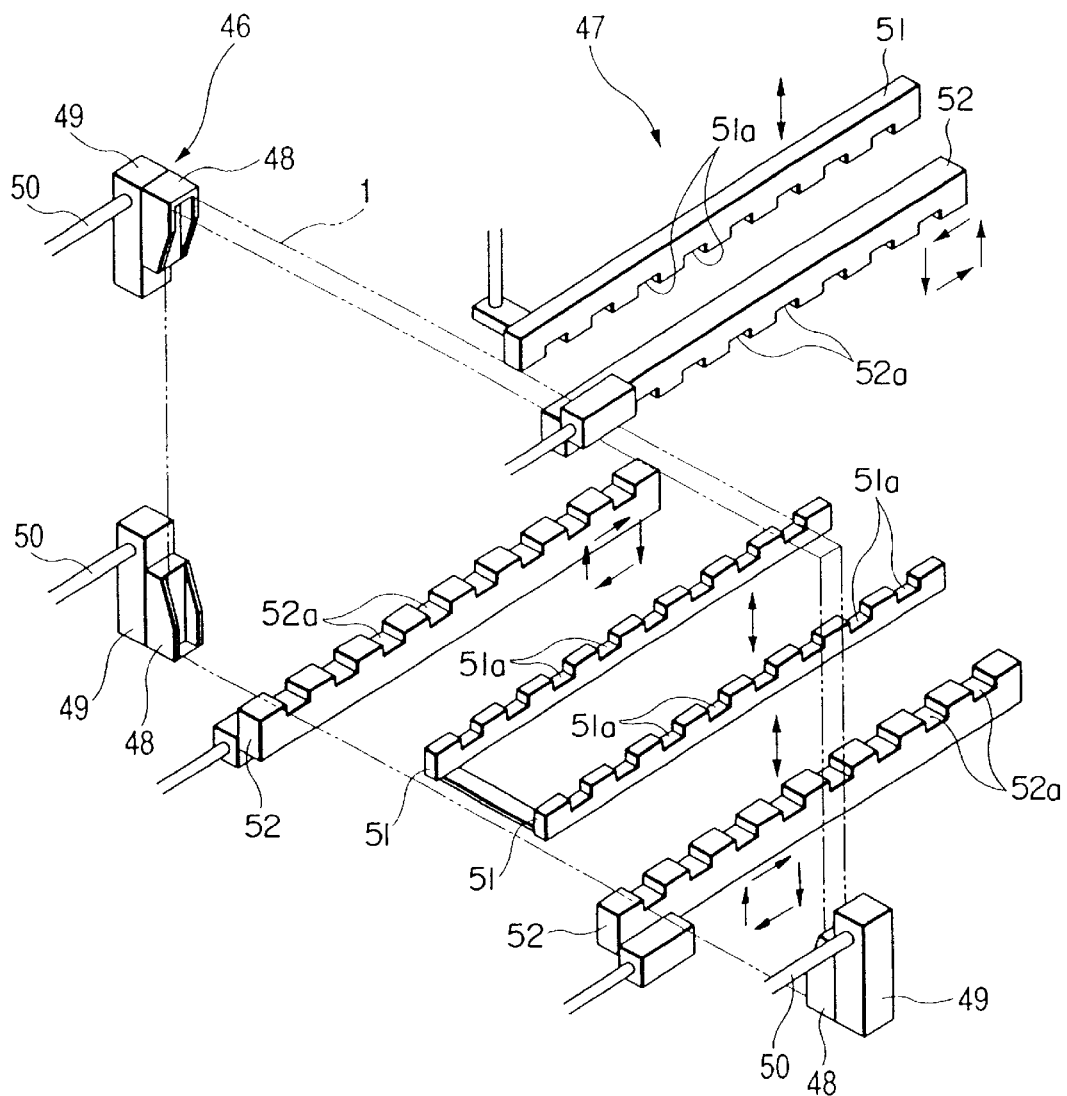
FIG. 7 is an external perspective view for showing a receiving means and a pitch sending means for the test board in the pre-heat portion.
Figure 8:
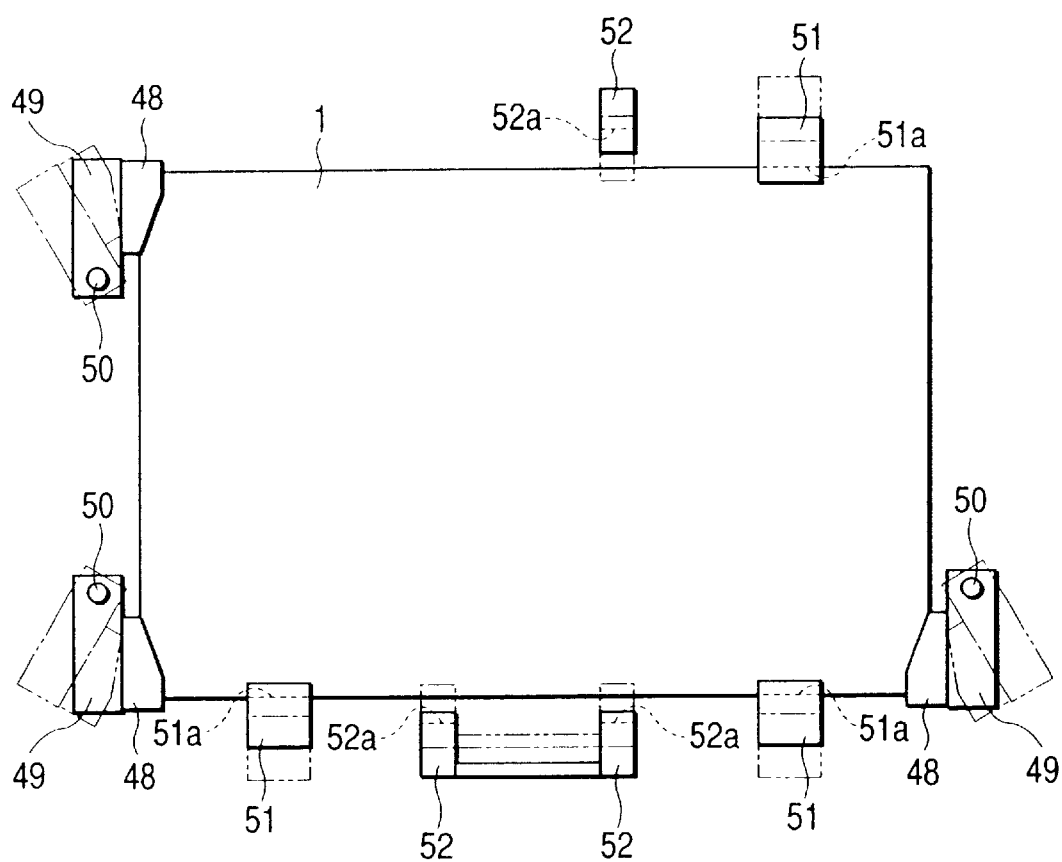
FIG. 8 is a front view of the test board shown in the FIG. 7.

As is apparent from the FIG. 7, the receiving means 46 and the pitch transfer means 47 are constructed so that they support the test board 1 in the vertical standing condition on two (2) points in the lower side while on one (1) point in the upper side thereof. The receiving means 46 has pocket members 48 for receiving the edge portions therein, i.e., two (2) in the lower side and one (1) in the upper side of the test board 1, and those pocket members 48 are provided with being connected to jolting blocks 49, respectively. Herein, each the pocket member 48 comprises a L-like surface abutting on the corner portion of the test board 1 and plate-like surfaces abutting on the front and reverse side surfaces at this corner portion. Also to the jolting block 49 is attached a rotation shaft 50, to be reciprocally jolted by a predetermined angle by means of this rotation shaft 50. With jolting of this jolting block 49, the pocket members 48 are shifted in positions, between a holding position of the test board indicated by the solid lines in the FIG. 8 and a retreat position indicated by the imaginary lines therein.

Among the three (3) pocket members 48 provided, withholding the pocket member 48 located at the upper portion at the test board holding position, while the two (2) pocket members 48 and 48 located in the lower portion are at the retreat position, the test board 1 is pushed up under this condition to be shifted up to the pre-heat portion 11. Then, after one of the corners of the test board 1 in the upper portion enters into the pocket member 48,the two (2) pocket members 48 and 48 located in the lower portion thereof is shifted from the retreat position to the test board holding position. With this, the test board 1 is held by the respective pocket members 48 at the three (3) corner portions thereof. Thereafter, the lifter 34 is descended down, thereby transferring the test board 1 into the pre-heat portion 11.

The pitch transfer means 47 is constructed with support bars being driven in an elevating manner and transfer bars 52 moving in a rectangular manner. And, as is apparent from the FIG. 8, those support bar 51 and transfer bar 52 are able to contact with or separate from the test board 1, i.e., at two (2) points on the lower surface and at one (1) point on the upper surface thereof, therefore a predetermined number of receipt gutters 51a and 52a are provided on the support bar 51 and transfer bar 52, respectively. The support bars 51 and the transfer bars 52 make a similar movement, but the elevating movement of the support bar 51 and the transfer bar 52 provided on the upper side is opposite to that of those provided on the lower side. Namely, when the support bars 51 or the transfer bars 52 provided on the lower side are descended down, the support bar 51 or the transfer bar 52 provided on the upper side rises up. However, the transferring directions of the transfer bars 52 are in the same.

Next, explanation will be given on the operation of pitch transfer of the test board 1. The first receipt groove 51a on the support bar 51 located at the position, being separate from the position where the pocket members 48 are provided in the receiving means 46, by the distance of one (1) pitch in the pitch distance of the receipt groove 51a, and a stroke of elevating movement thereof is at least to be equal or larger than the depth of the receipt groove 51a. Also the elevating stroke of the transfer bar 52 is be equal or larger than the depth of the receipt groove 52a, and the stroke in the movement in front or back is coincident with the distance of one (1) pitch of the receipt groove 52a. And, the first receipt groove 52a on the transfer bar 52 is at the same position to that of the pocket members 48 at the move-back position in the movement in front or back, and is at the position being coincident with that of the first receipt groove 51a on the support bar 51, in an advanced position.

When the test board 1 is held in those three (3) pocket members 48, constructing the receiving means 46 therewith, and when the lifter 34 is descended down, the lower transfer bars 52 are descended down while the upper transfer bar 52 is shifted back to the retreat position under the condition of being risen up, and next the lower transfer bars 52 are risen up while the upper transfer bar 52 is descended down, thereby bringing the first receipt grooves 52a on those transfer bars 52 engaging with the test board 1. In this instance, if there is a proceeding test board, the test board 1 comes to be engaged with the receipt grooves 52a following thereto. Under the condition of this, the pocket members 48 are shifted into the retreat position while operating the support bar 51, i.e., the lower support bars 51 are descended down while the upper support bar 51 is risen up. With this, all the test boards 1 are supported by three (3) pieces of the transfer bars 52, but are in condition of non-engagement with the other members. Then, they are advanced by one (1) pitch each, while maintaining the height of the transfer bars 52. With this, the test boards 1 are delivered from the receiving means 46 to the pitch transfer means 47, and the other test boards 1 located within the pre-heat portion 11 are transferred by one (1) pitch each. Thereafter, operating the support bars 51 so that the test board 1 transferred by one (1) pitch is brought to be engaged with the receipt groove 51a formed on each of the support bars 51, and further the transfer bars 52 are separated from the test boards 1. During this operation, the inter-loader portion and pre-heat portion shift mechanism 30 is operated so that the next test board 1 is received by means of the receiving means 46. Then, by repeating the operations mentioned above after retreating or moving back the transfer bars 52, the test boards 1 are transferred further by one (1) pitch each.

In the manner mentioned above, the test board 1 being transferred into the pre-heat portion 11 is heated up or cooled down to the preset value in temperature thereof during when it is transferred by pitches within this pre-heat portion 11. Then, when the test board 1 reaches up to the most advanced position thereof, the devices 5 mounted on the test board 1 are at the preset temperature. Accordingly, the test board 1 mounting the devices 5 which are at the preset temperature in this manner thereon is Transferred into the testing/measuring portion 12 with keeping the vertical standing condition thereof. A transfer means for use in transfer of the test boards 1 with vertical standing position can be constructed, for example, as is shown in FIG. 9.

Figure 9:
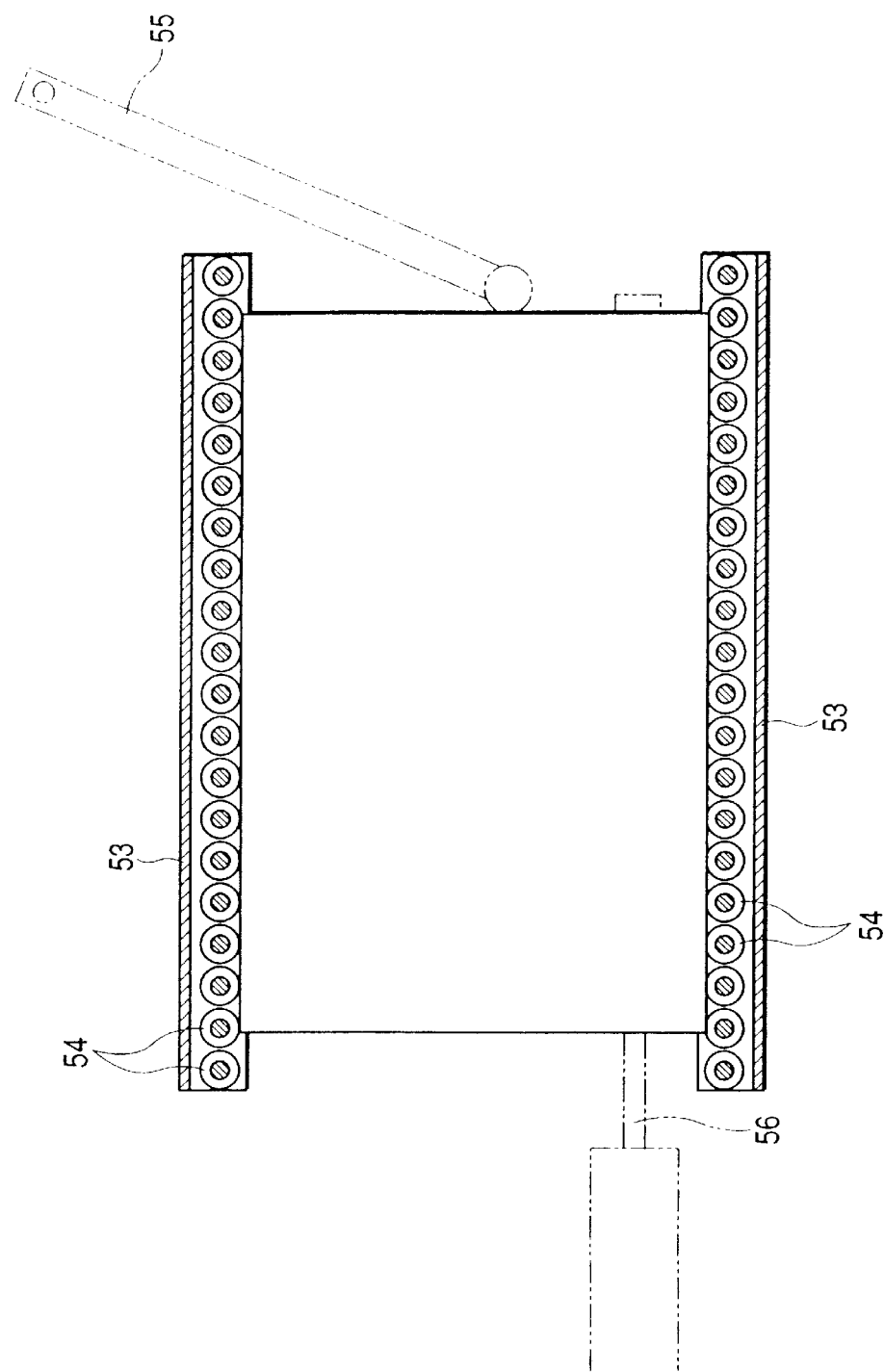
FIG. 9 is an explanatory view for showing the structure of an example of a vertical transfer means for the test board.
Figure 10:
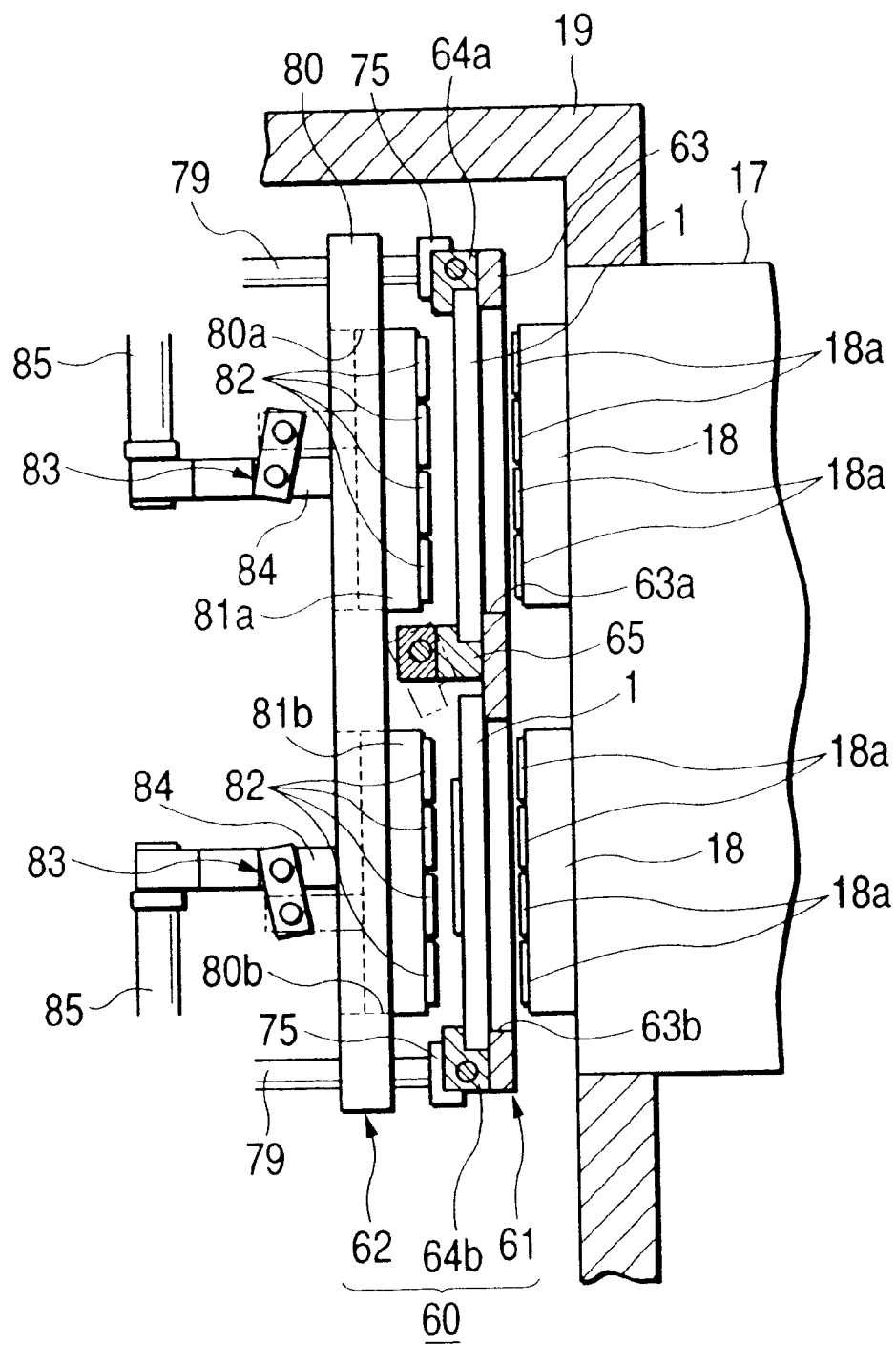
FIG. 10 is a side view of a contact/separate means in a test/measuring portion.

As is apparent from this FIG. 9, the vertical position transfer means has guide ways 53 and 53 for guiding the test board 1 on the upper and lower edge surfaces thereof, and on the each guide way 53 is provided rollers 54 rotating on the edge surfaces of the test board 1. And, as a transfer drive means for transferring the test board 1 along with the guide way 53, for example, there can be used a swing arm 55 or a pull-in arm 56, etc. Accordingly, the pre-heat portion 11 and the testing/measuring portion 12 are connected with the guide ways 53, and the test boards 1 are driven by the transfer drive means mentioned previously to be transferred into the testing/measuring portion 12. However, this vertical position transfer means can be used, not only for transferring the test boards 1 from the pre-heat portion 11 to the testing/measuring portion 12, but also for transferring them from the testing/measuring portion 12 to the defroster portion 13.

Next, the structure of the testing/measuring portion 12 will be shown in FIGS. 10 through 13. Herein, the testing/measuring portion 12 is provided within the thermostatic chamber 19 for the purpose of maintaining the devices 5, which are heated up or cooled down to the preset temperature in the pre-heat portion 11, under that temperature condition, i.e., so as to maintain them at the preset temperature until when the testing/measuring is completed. Further, for suppressing the errors with respect to the preset temperature during the testing/measuring at the minimum, further strict control of temperature is performed within the region of the testing/measuring portion 12. Also, at the position of the testing/measuring portion 12 within the thermostatic chamber 19, as be apparent from the FIG. 10, an opening is formed so as to confront with the test heads 18 of the IC tester 17. In the testing/measuring portion 12, the test boards 1 transferred in the vertically standing condition thereof are positioned at a predetermined position, and there is provided a contact/separate means 60 for bringing them in contact with or separate from the test heads 18. The contact/separate means 60 comprises a board positioning units 61 and a pusher unit 62.

Herein, the test heads 18 are provided in two (2) stages in the vertical direction, so that the testing on the electric property can be performed for each of the devices 5 which are mounted on the two (2) pieces of the test boards, simultaneously. Here, though it may be possible to construct it so that all the devices 5 mounted on the test boards 2 can be tested by the contacting/separating operation of one time, however there can be a case where it is impossible to ensure a space on the test head 18, being enough for providing contact portions 18a corresponding to the number of the devices 5 mounted on those test boards 1. For that purpose, it also can be conducted, not conducting the testing upon all the devices 5 mounted on the test boards 1 as the same time, but by bringing the contact portions 18a of the test heads 18 to contact with them, one by one, in the direction being orthogonal to the sheet surface of the FIG. 10, i.e., with devices 5 aligned in the horizontal direction on the FIG. 11. Therefore, in the figure is disclosed the construction, in which the testing is conducted on one (1) piece of the test board 1 by dividing it into two (2) times. Then, after connecting the test board 1 with the test head 18 once, it is shifted by one pitch in the horizontal direction, thereby to be connected with the test head 18 again. However, in case of using the test head comprising a number of contact portions corresponding to that of mounting the devices 5 on the test board 1, there is no need of the mechanism for shifting the test boards 1 in the horizontal direction.

The board positioning unit 61 has, as is apparent from the FIG. 11, a holder frame 63 provided in the vertical standing condition, and on this holder frame 63 are formed a first opening in the upper part and a second opening below the horizontal plane H. Each of those first and second openings is smaller than the external shape of the test board 1, and has the shape being substantially equal to an inside of the outer peripheral frame 1b in outline, then two (2) pieces of the test boards 1 and 1 are contacted with or separated from the test heads 18 via those openings. Thus, the position of the first opening in the upper portion side defines a first test board positioning portion 63a, and that of the second opening in the lower portion side defines a second test board positioning portion 63b. The test board 1 transferred into from the pre-heat portion 11, passing through the first test board positioning portion 63a first, is transferred to the second test board positioning portion 63b, and a next one is transferred into the first test board positioning portion 63a. In this manner, the two (2) pieces of the test boards, being transferred into the first and the second test board positioning portions 63a and 63b, are positioned at the predetermined positions and are held fixedly at those positions, respectively. Namely, the test boards 1 are carried into the first test board positioning portion 63a of the board positioning unit 61 as in the direction of an arrow I in the FIG. 11, and next they are descended, as indicated by an arrow D in a direction from the first test board positioning portion 63a down to the second test board positioning portion 63b, within this board positioning unit 61. Further, they are carried outside from the second test board positioning portion 63b as shown by an arrow O.

In the manner mentioned in the above, for guiding the moving direction of the test boards 1 transferred, as well as for holding them at the predetermined positions in the first and second test board positioning portions 63a and 63b, respectively, guide blocks 64a and 64b are fixedly provided at both upper and lower edge portions of the holder frame 63. The guide block 64a on the upper side is provided for guiding the upper edge portion of the test board 1 in the first test board positioning portion 63a, and for that it comprises a portion projecting downward, thereby forming a receiving portion of reversed L-like shape. Also, the guide block 64b at the lower side is provided for the purpose of guiding the test board 1 on the lower edge portion thereof in the second test board positioning portion 63b, therefore it is projected upward, thereby forming a receiving portion of L-like shape. Between the first and second test board positioning portions 63a and 63b is provided a movable guide 65.

The movable guide 65 is provided for guiding the test board 1 at the lower edge portion thereof in the first test board positioning portion 63a, therefore it comprises a portion projecting upward. When the test board 1 is carried into the first test board positioning portion 63a, the movable guide 65 guides the test board thereon, however this movable guide 65 opens a passage when it is transferred from the first test board positioning portion 63a to the second test board positioning portion 63b. For that purpose, there is provided a rotating shaft 66 connected with the movable guide 65, thereby changing the position thereof into an operating position for slidably guiding the test board 1 at the lower edge portion thereof, and also into an opening position for enabling the test board 1 to be moved downward, by reciprocally rotating this rotating shaft 66 by a predetermined angle. Also, in the first test board positioning portion 63a is provided a side portion guide 67 being fixed on the holder frame 63, at a position in front of the moving direction of the test board 1, while in the second test board positioning portion 63b an other side portion guide 68 at the position opposing to the side portion guide 67 provided in the first test board positioning portion 63a.

Figure 11:
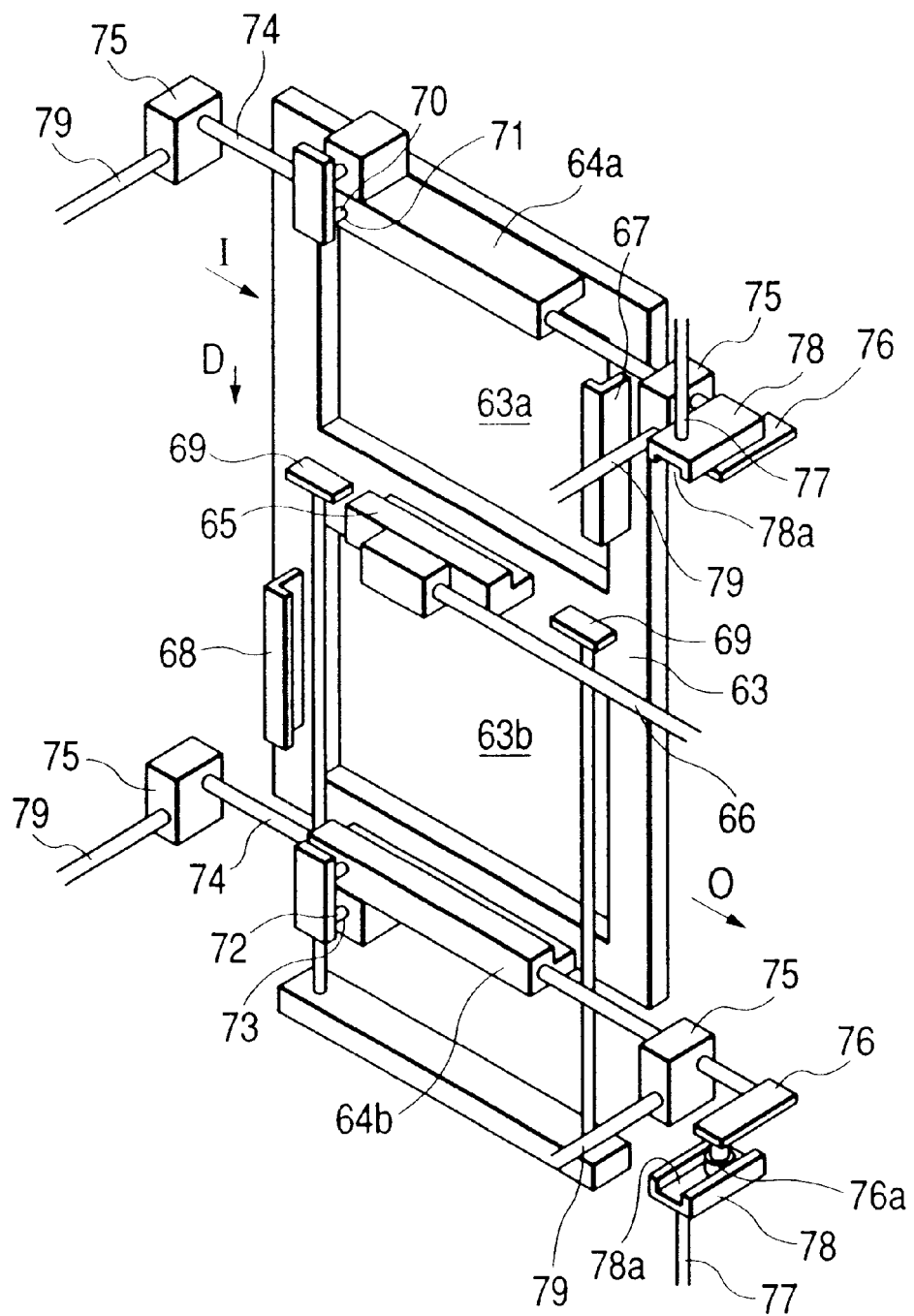
FIG. 11 is an explanatory view of the structure of a board positioning unit which constructs the contact/separate means.

In the first test board positioning portion 63a, the test board 1 is carried into from the left-hand side in the FIG. 11 and is stopped at the position where it abuts on the side portion guide 67 in the right-hand edge portion thereof. And, in the second test board positioning portion 63b, the test board 1 is guided by the side portion guide 68 in the right-hand edge portion thereof. Further, on both sides of the movable guide 65 are provided elevating plates 69, and those elevating plates 69 are driven in an elevating manner, between the position of the same height to 15 the guide surface of the test board 1 in the movable guide 65 and the position below the guide surface of the test board 1 in the lower side guide block 64b, therefore the test board 1 is transferred from the first test board positioning portion 63a to the second test board positioning portion 63b, by descending those elevating plates 69 from the upper end position down to the lower end position in the stroke thereof, under the condition that the movable guide 65 is rotated at the opening position.

For positioning the test boards 1 at the predetermined positions in the first and the second test board positioning portions 63a and 63b with accuracy, respectively, the movable guide 65 and the side portion guide 67 define reference walls in the first test board positioning portion 63a at the upper stage, thereby to position the test board 1 under the condition that it abuts on the reference walls at the two (2) sides thereof being adjacent to each other. And, for the purpose of preventing the test board 1 from being shifted in the position thereof recklessly, a positioning pin 70 is provided on the guide block 64a, while a through hole 71 is opened on the guide block 64a, so as to be inserted with that positioning pin 70 therein. By the way, on the a pusher base 80 which is fixedly provided inside the testing/measuring portion 12, and on this pusher base 80 are provided with block-like pushers 81a and 81b up and down, thereby those pushers 81a and 81b being able to project toward the side of positioning the holder frame 63, from openings 80a and 80b which are opened in the pusher base 80. On the front surface side of the pushers 81a and 81b, i.e., on the side opposing to the holder frame 63 are supported socket pusher portions 82 elastically, while on reverse surface sides thereof being connected to pusher drive members 83.

With such the construction mentioned in the above, first by pulling out the positioning pins 70 and 72 while holding the movable guide 65 at the operating position, and further keeping the elevating plates 69 in the elevating condition, the test board 1 is transferred from the pre-heat portion 11 into the contact/separate means 60 in the testing/measuring portion 12. The test board 1 is transferred into the first test board positioning portion 63a in the holder frame 63, while being guided by the guide block 64a and the movable guide 65 at the both upper and lower edge portions thereof. And, when the test board 1 abuts on the side portion guide 67, the transfer thereof is stopped at that position. Under that condition, the passage from the first test board positioning portion 63a to the second test board positioning portion 63b is opened by moving the movable guide 65 into the retreat position. Next, when the elevating plates 69 are descended down, the test board 1 is also descended down depending on the movement of the elevating plates 69, to be transferred into the second test board positioning portion 63b. The test board 1 is guided by the side portion guides 67 and 68 when being descended down. When the lower portion of the test board 1 abuts on the guide block 64b, the positioning pin 72 is operated to be entered into the positioning hole 3 of the test board 1. With this, one (1) piece of the test board 1 is positioned and held in the second test board positioning portion 63b. However, the elevating plates 69 are further descended down, and as a result of this, they are separated from the lower end portion of the test board 1.

From that condition mentioned in the above, the moveable guide 65 is turned back into the operating position, so as to carry the next test board 1 into the first test board positioning portion 63a. And, when this test board 1 comes to a position where it abuts on the side portion guide 67, the positioning pin 70 provided in the guide block 64a is operated to be entered into the positioning hole 3 of the test board 1. With this, the second test board 1 is positioned and fixed. As a result of this, when connecting the two (2) pieces of the test boards 1 with the test heads 18 simultaneously, the two (2) pieces of the test boards 1 and 1 are fixed, simultaneously, and when they are separated from the test heads 18, the two (2) pieces of the test boards come to a condition, substantially same to the construction of one (1) piece thereof. Also, those two (2) pieces of the test boards 1 are located in the upper and the lower positions putting the horizontal plane H therebetween.

The two (2) pieces of the test board 1 and 1 are positioned and fixed in the holder frame 63 in this manner, and the devices 5 mounted on those two (2) pieces of the test board 1 which are fixed on the holder frame 63 are connected with the contact portions 18a of the test heads 18. And, the number of the contact portions 18a of one test head 18 is set by a half (½) of that of the devices 5 mounted on the test board 1, therefore after connecting and completing the testing of the devices 5 once, the holder frame 63 is shifted horizontally by one pitch of the device 5, and it is pushed up again. After that, the holder frame 63 is operated to turn back to the original position thereof.

For that purpose, on the both sides of the guide blocks 64a and 64b which are provided to be fixed on the holder frame 63, there are provided horizontal support shafts 74 being continuously connected and directed in the horizontal direction therefrom. And, those four (4) horizontal support shafts 74 are inserted into support blocks 75, respectively, in a slidable manner. And, one end portion of each of the upper and lower horizontal support shafts 74 extends through the support block 75, and at that end portion is continuously connected to a slide drive plate 76. On each of those slide drive plates 76 is attached with a roller 76a, and this roller 76a is engaged with a guiding gutter 78a provided on a working plate 78 connected with a rotary shaft 77. Accordingly, by rotating the rotary shaft 77 by a predetermined angle, the holder frame 63 can be shifted by one (1) pitch in the horizontal direction.

In the support blocks 75 provided at four (4) positions are inserted back and forth support shafts 79, respectively, then the support blocks 75 are slidable along with those back and forth support shafts 79. Those back and forth support shafts 79 are elongated in direction facing to the test heads 18, therefore the holder frame 63, which is connected to those support blocks 75 through the horizontal support shafts 74, is moved in the direction to contact with or separate from the test heads 18 when the support blocks 75 are slid along with the back and forth support shafts 79.

The pusher unit 62 is provided for the purpose of pushing the holder frame 63 on which the test boards 1 are positioned and fixed, directing to side of the test heads 18, wherein the pushing force by means of this pusher unit 62 acts, in more detail, upon the test boards 1 which are positioned up and down. Accordingly, the pusher unit 62, being positioned in nearly horizontal to the holder frame 63 at the opposing side to the test heads 18, comprises a pusher base 80 which is fixedly provided inside the testing/measuring portion 12, and on this pusher base 80 are provided with block-like pushers 81a and 81b up and down, thereby those pushers 81a and 81b being able to project toward the side of positioning the holder frame 63, from openings 80a and 80b which are opened in the pusher base 80. On the front surface side of the pushers 81a and 81b, i.e., on the side opposing to the holder frame 63 are supported socket pusher portions 82 elastically, while on reverse surface sides thereof being connected to pusher drive members 83.

Figure 12:
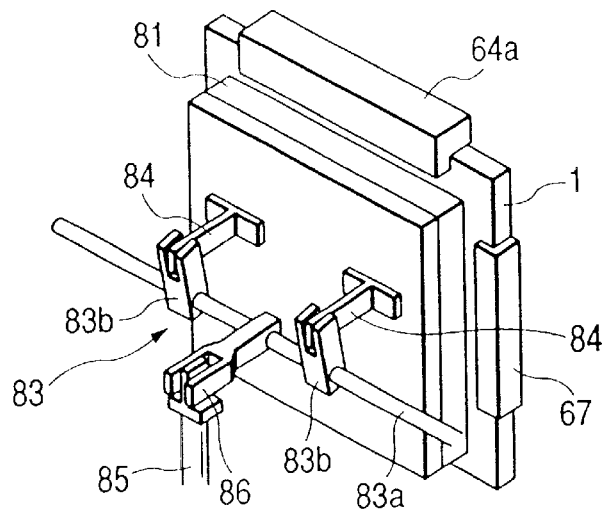
FIG. 12 is a view of the essential structure of a pusher unit which constructs the contact/separate means.

Each of those pusher drive members 83 has, as shown in the FIG. 12, a shaft 83a being supported on the pusher bases 80 at the both ends thereof, and a lever 83b being attached on this shaft 83a, wherein the levers 83b are connected to arms 84 which are connected to the pushers 81a and 81b at the reverse surface sides thereof, being pivotally movable. Accordingly, when the shaft 83a is rotated around the shaft so as to drive the levers 83b rotationally, the arms 84 are moved back and forth depending upon the movement thereof. And, for rotating the shaft 83a, a driver shaft 85 is extended vertically or up and down, and to this driver shaft 85 is pivotally connected an end portion of a rotary lever 86 which is connected to the shaft 83a. Accordingly, though the pushers 81a and 81b are shifted through the movement of the driver shaft 85 up and down, however those pushers 81a and 81b can move swingingly to the peripheral walls of the openings 80a and 80b formed in the pusher base 80, as a result of this, the pushers 81a and 81b are moved back and forth, thereby pushing the holder frame 63 toward the test heads 18 via the test boards 1 held on the holder frame 63. And, when the holder frame 63 is pushed to the side of the test heads 18, the devices 5 which are mounted on the sockets provided in the test boards 1 abut on the contact portions 18a, however at this instance, each of the sockets 2 is suppressed to be connected to the contact portion 18a, individually or separately, through function of the each socket pusher portion 82 which is elastically supported on each of the pushers 81a and 81a As a result of this, each electrode of the device 5 are electrically connected to each electrode of the contact portion 18a with certainty.

Also, when the pushers 81a and 81b are pulled up toward the side pusher base 80, or after that, the holder frame 63 must be separated from the test heads 18, however the returning operation of this holder frame 63 may be achieved by the construction of inserting a spring not shown in the figure, for example, in each of the back and forth support shaft 79, or by means of connecting a pull-back member(s) engaged with the holder frame 63.

With the construction mentioned in the above, the testing of the electric property is conducted on all the devices 5 set on the test boards 1 carried into the testing/measuring portion 12, and the testing can be conducted on the two (2) pieces of the test boards 1 and 1, at the same time. Namely, though the test board 1 which is carried into the testing/measuring portion 12 first, is sent into the first test board positioning portion 63a located at the upper stage in the holder frame 63 constructing the board positioning unit 61 therewith, this test board 1 is further transferred from the first test board positioning portion 63a to the second test board positioning portion 63b. Since this second test board positioning portion 63b lies in the lower position of the first test board positioning portion 63a, the test board 1 is descended down by it's own weight substantially, though it is guided by the elevating plates 69 when being transferred, there is no necessity of acting particular driving power thereupon, and when the test board 1 is positioned in the second test board positioning portion 63b, since it is guided by the guide block 64b and the side portion guide 68, it can be separated or removed from the board positioning unit 61, as a whole, which supports it, completely, by further descending the elevating plates 69 down. Next, another one piece of the test board 1 is sent into the first test board positioning portion 63a.

After those two (2) pieces of the test boards 1 and 1 are positioned and fixed at the predetermined position by inserting the positioning pins 70 and 72 into the positioning holes 3 thereof, respectively, to engage with, the testing of the electric property is executed on the devices 5 mounted on those two (2) pieces of the test boards 1. First, by operating the pusher unit 62, the holder frame 63 supporting the two (2) pieces of the test boards 1 and 1 is shifted toward the test heads 18, as shown in the FIG. 13, thereby connecting or contacting the devices 5 onto the contact portions 18a on those contact heads 18. As a result of this, the testing is conducted on a half of the devices of all the devices 5 which are mounted on each of the test boards 1. After that, the pusher unit 62 and the holder frame 63 are turned back to the original positions thereof, and after shifting the holder frame 63 in the horizontal direction by one pitch of the devices 5, the holder frame 63 is shifted into the side of the test head 18 by operating the pusher unit 62 again, thereby conducting the testing on the remaining half of the devices 5 mounted on each of the test boards 1, again.

When completing the testing on all of the devices 5, after removing or separating the holder frame 63 and sending it in the horizontal direction by one pitch further, so as to be turned back to the position of an original starting point, the two (2) pieces of the test boards 1 and 1 are taken out from the holder frame 63 one by one, and are sent into the defroster portion 13. In this operation, first the test board 1 is taken out from the second test board positioning portion 63b, and next the test board 1 locating at the first test board positioning portion 63a is sent out into the defroster portion 13 after being transferred to the second test board positioning portion 63b.

As was mentioned in the above, the two (2) pieces of the test boards are connected to the test heads 18 at the same time, however after those two (2) pieces of the test boards 1 and 1 are positioned and fixed on the holder frame 63, this holder frame 63 is shifted. Thus, since it is not necessary to position or align the test boards 1 to the test heads 18, individually or separately, and it is enough to conduct the positioning only between the one (1) piece of the holder frame 63, the positioning of the test boards 1 to the test heads 18 can be very simplified and can be conducted quickly. Since such the complicated operations must be carried out, such as, sending the test head(s) in the horizontal direction by one (1) pitch and conducting the operations of contacting/separating two (2) times, in particular when conducting the testing, the fact that the simplification can be obtained in the positioning is very advantageous.

Further, the positioning of the test heads 18 is conducted by means of the holder frame 63, however the actual contact is brought about between the device 5 mounted on the each socket of the two (2) pieces of the test boards land the each contact portion 18a of the test heads 18. In the pusher unit 62, since the mechanism for pushing the each device 5, to connect it to the contact portion 18a, comprises the pushers 81a and 81b, which are supported on the pusher base 80 and push the upper and lower test boards 1 and 1 individually or separately, and further since on those pushers 81a and 81b are supported the socket pusher portions 82 elastically and those socket pusher portions 82 push the devices 5 independently, it is possible to push the upper and lower test boards 1 and 1 in uniform, thereby enabling to act a desired pressing and contacting force or power upon each of the contact portions 18a of the test heads 18, with respect to each of the device 5 mounted on the test boards 1, but there is no possibility of occurring poor contact in a part of the devices 5.

Also, the test boards 1 are transferred or carried into the horizontal direction under the vertical standing condition, however since those are positioned up and down for achieving the simultaneous testing of the two (2) pieces of test boards 1, the transfer of the test boards 1 from the first test board positioning portion 63a of the holder frame 63 to the second test board positioning portion 63b thereof can be obtained substantially by the effect of the gravity, without necessity of provision of a particular transfer means. Accordingly, the board positioning unit 61 can be simplified in the structure thereof, as a result of this it is possible to make volume of the testing/measuring portion 12 small. Herein, the testing/measuring portion 12 is positioned within the thermostatic chamber 19 for maintaining the devices 5 at the preset temperature during the testing thereof, i.e., to be protected from the fluctuation of temperature thereof, however for obtaining further improvement of testing accuracy, very strict adjustment in the control or management of temperature is needed in the testing/measuring portion 12. Accordingly, the temperature control in the testing/measuring portion 12 must be carried out in a manner being independent from that in the pre-heat portion 11 in a certain degree. For this purpose, the fact that the volume of contents of the testing/measuring portion 12 can be small-sized means the temperature control can be made easier for it, and with correctness. As a result, the test accuracy can be improved remarkably.

The test boards 1 transferred into the defroster portion 13 is cooled down or heated up to be near to the temperature of the outer air within the defroster 13. Within this defroster 13, the test boards 1 are sent or transferred by pitch, however as the structure of such the pitch transfer mechanism can be applied the mechanism which is substantially same to the pitch transfer mechanism provided in the pre-heat portion 11.

Figure 14:
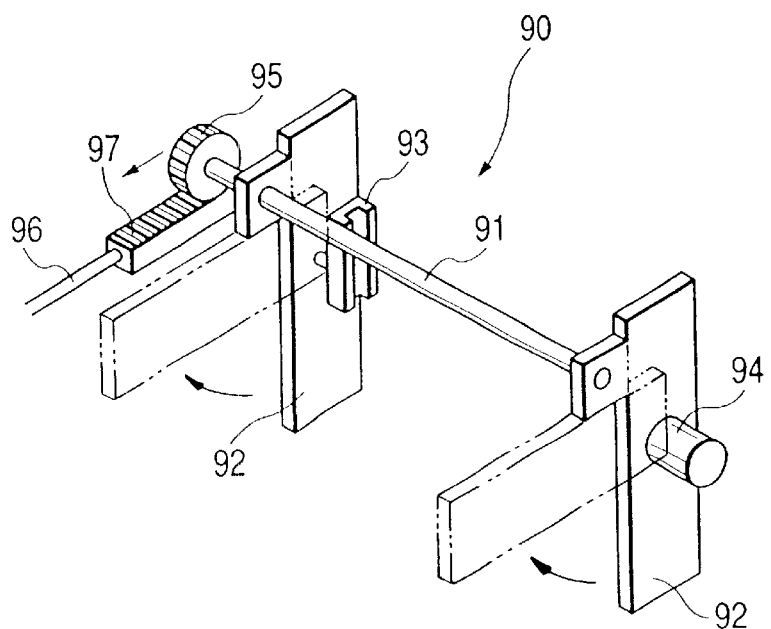
FIG. 14 is an external perspective view of a second reverse means for the test board which constructs the transfer means from the loader portion to the pre-heat portion.
Figure 13:
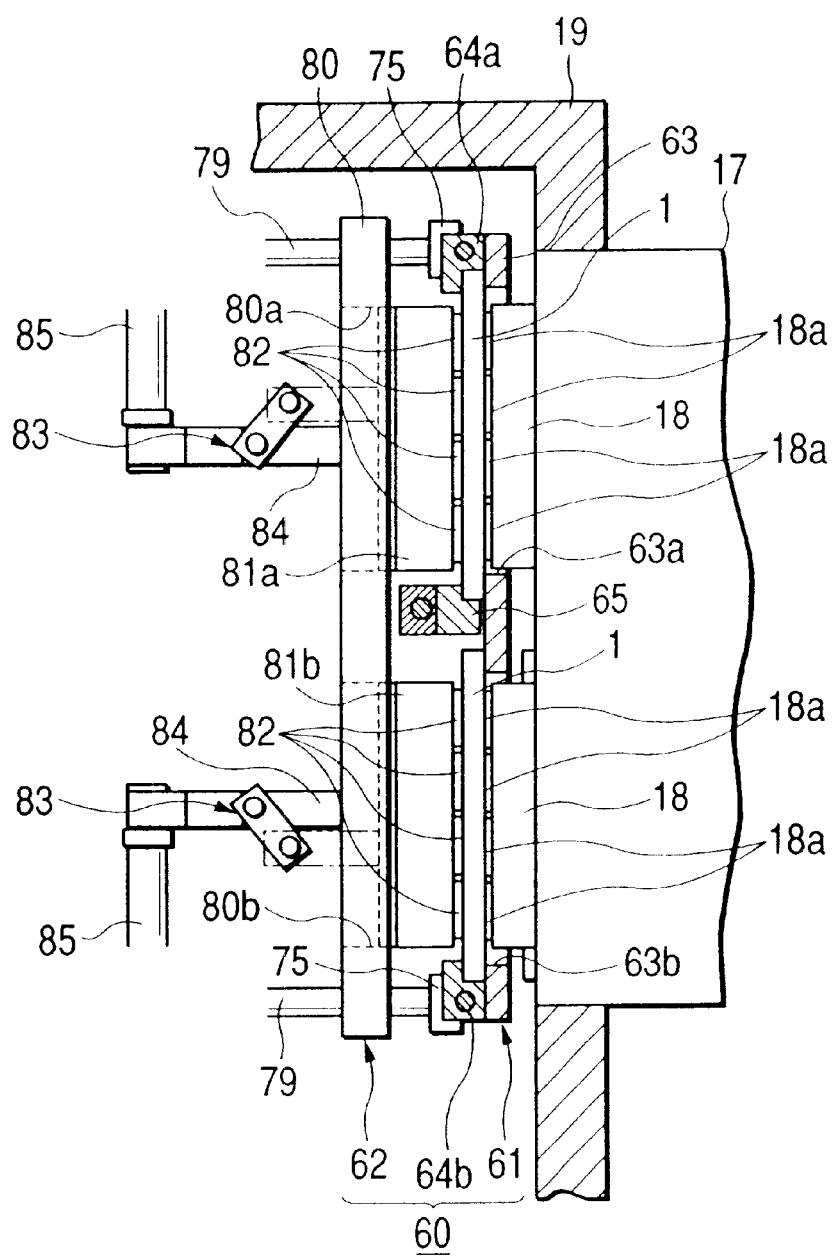
FIG. 13 is a side view for showing operating condition of the contact/separate means, in the same manner as in the FIG. 10.

Within the defroster portion 13, the test boards 1 are kept under the vertical standing condition, however in the unloader -portion 14, the unloading operation of the test boards 1 is carried out under the condition that the test boards 1 lying in the horizontal condition. For this, during when they are transferred from the defroster portion 13 to the unloader potion 14, the test boards 1 must be changed in the posture or position thereof from the vertical standing condition into the horizontal condition. Herein, into the defroster portion 13 is transferred the test boards 1 from the second test board positioning portion 63b located below the horizontal plane H in the holder frame 63 which constructs the board positioning unit 61 positioned in the testing/measuring portion 12, therefore the defroster portion 13 is located below the horizontal plane H. Accordingly, the test boards 1 must be changed in the posture thereof into the horizontal condition, at the position of height almost same to the horizontal plane H. For this reason, at the position of an exit of the defroster 13 is provided a second test board reversing means 90 which constructs an inter-defroster portion and unloader portion transfer means, shown in FIG. 14.

The second test board reversing means 90 has a pair of plate bodies 92 and 92, which are provided to be fixed on a reverse shaft 91, and both those plate bodies 92 and 92 are separately disposed at the positions with a distance therebetween, being sufficiently wider than the width size of the test board 1. And, on both surfaces of the plate bodies 92 and 92, facing to each other, there are provided hold dampers 93, each having U-like cross-section, so that they can be moved in directions to come close or separate from each other by a cylinder 94. And, at one end of the reverse shaft 91 is attached a pinion 95, and this pinion 95 is engaged with a rack 97 which is connected to a drive shaft 96.

With the construction mentioned in the above, while maintaining the both plate bodies 92 and 92 constructing the second test board reversing means 90 under the vertical standing condition, the dampers 93 and 93 provided thereon are held at a distance being wider than the width size of the test board 1, thereby positioning the test board 1 at the terminal position on the pitch transfer means within the defroster portion 13. When the test board 1 proceeds to the position of the hold dampers 93 by the pitch transfer means, the cylinder 94 is operated so that the test board 1 is clamped by the both hold dampers 93 from both sides thereof. Under this condition, when the drive shaft 96 is pushed up in the direction of an arrow in the FIG. 14, the reverse shaft 91 is reversed so that the both plate bodies 92 and 92 are turned to be in the horizontal condition, as indicated by the imaginary lines in the same figure. With this, the test board 1 is changed from the vertical condition to the horizontal condition in the position or posture thereof, however is maintained at the position being almost as high as the horizontal plane H.

In the manner as mentioned in the above, the test boards 1 which are brought into the horizontal lying condition by the second test board reversing means 90 are transferred to the unloader portion 14 through an appropriate transfer means, to be carried out the unloading operation thereon. In this unloading operation, each of the devices 5 mounted on the each socket 2 in the test board 1 is classified upon the basis of the test result thereof, to be transferred or moved into the respective one of the trays 16 which are provided for each of classes, however as the structure of this transfer means can be used that which has the same structure as the clamp release plate body 20 and the vacuum suction means 23, which are provided in the loader portion 10.

In accordance with the present invention having the structure mentioned above, it is possible to perform the testing/measuring of the IC devices which are mounted on two (2) test boards, simultaneously, thereby obtaining an effect that the testing can be performed quickly and effectively.

What is claimed is:

1. A testing apparatus of IC devices comprising:
   loader portion for loading test boards, having a surface on which are mounted a predetermined number of IC devices;
   a pre-heat portion for heating or cooling the IC devices mounted on said test boards and transferred from said loader portion to a predetermined temperature;
   a testing/measuring portion for introducing the IC devices mounted on said test boards and connecting them with test heads, so as to conduct testing/measuring of electric properties on each of the IC devices;
   a defroster portion for defrosting the IC devices mounted on said test boards after the testing/measuring being conducted thereon in said testing/measuring portion; and
   an unloader portion for unloading the IC devices mounted on said test boards, after being defrosted in said defroster portion, wherein
      horizontal transportation means are provided for transporting said test boards on substantially a same horizontal plane in said loader portion and said unloader portion, and vertical transportation means are provided for transporting said test boards under vertically standing condition thereof in said pre-heat portion, said testing/measuring portion and said defroster portion;
      said pre-heat portion is disposed in a position being above said horizontal plane, while said defroster portion is disposed in a position lower than said horizontal plane; and
      contacting/separating means are provided for connecting and separating the IC devices mounted on said testing boards with/from said test heads, after positioning said test boards in an upper position and a lower position with respect to said horizontal plane, respectively, in said testing/measuring portion.

2. A testing apparatus of IC devices, as defined in the claim 1, wherein on said test board are provided a predetermined number of mounting portions on which the IC devices are mounted, being aligned vertically and horizontally, and in each of those mounting portions is provided a clamp member for clamping the IC device under condition of able to be opened or closed.

3. A testing apparatus of IC devices, as defined in the claim 1, wherein in a transit portion from said loader portion to said pre-heat portion are provided a first board reverse means for reversing said test board from the horizontal condition into the vertical condition directing downward, and a push-up means for pushing the test board in the vertical condition by this first board reverse means up to the position as high as said pre-heat portion, while in a transit portion from said defroster portion to said unloader portion is provided a second board reverse means for reversing said test board from the vertical condition into the horizontal condition at the position as high as said horizontal plane or in vicinity thereof, around an upper position thereof.

4. A testing apparatus of IC devices, as defined in the claim 1, wherein said contact/separate means comprises a board disposition unit for positioning said test boards into two stages locating up and down, and a pusher unit for connecting this board disposition unit to said test heads.

5. A testing apparatus of IC devices, as defined in the claim 4, wherein said board disposition unit has at least a holder frame which can be shifted into a direction being close to or separate from said test heads, and this holder frame comprises first and second test board disposition portions located up and down, further an inlet for the test board is provided at an upper portion of one side portion while an exit for the test board at other side portion at a lower position thereof, and a transfer passage for the test board is formed from the first test board disposition portion to the second test board disposition portion.

6. A testing apparatus of IC devices, as defined in the claim 5, wherein said first and second test board disposition portions are formed on a surface opposite to that of said holder frame facing to said test heads, and in each of said first and second test board disposition portions is formed an opening for exposing a portion of said test board, where the IC devices are mounted on, and further in each test board disposition portion are provided guide members for guiding the test board at a lower end portion and a side portion thereof and a positioning means made of a positioning pin which can be engaged with the test board, while in said test board is formed a positioning hole into which the positioning pin can be inserted.

7. A testing apparatus of IC devices, as defined in the claim 6, wherein a guide member for guiding said test board in said first test board disposition portion is provided in said transfer passage, and the guide member can be opened or closed in front of the passage from said first test board disposition portion to said second test board disposition portion.

8. A testing apparatus of IC devices, as defined in the claim 5, wherein said holder frame can be shifted in horizontal direction by a distance of pitch in positioning the IC devices which are mounted on said test board.

9. A testing apparatus of IC devices, as defined in the claim 5, wherein said pusher unit comprises a pusher base, which is disposed on a side opposite to that facing to said test heads in said holder frame, and pushers being supported on the pusher base and for pushing each of the test boards, which are positioned in said first and second test board disposition portions, toward said test heads, individually.

10. A testing apparatus of IC devices, comprising:
   a loader portion for mounting a predetermined number of the IC devices on each of test boards transferred on a horizontal reference plane;
   a pre-heat portion for receiving the test boards transferred on said horizontal plane from said loader portion and so as to bringing the IC devices mounted thereon into a predetermined temperature condition;

a testing/measuring portion having test heads and for performing testing/measuring on the IC devices mounted on the test boards;

a defroster portion for receiving the test boards transferred from said testing/measuring portion and for bringing the IC devices completed with testing/measuring thereon into other predetermined temperature condition; and an unloader portion for receiving the test boards transferred on said horizontal reference plane from said defroster portion so as to unload the IC devices from the test boards depending on test results obtained in said testing/measuring portion, wherein each of said test boards is constructed to holds the IC devices mounted thereon when it is in a vertical standing condition, and further in said testing/measuring portion is provided a contact/separate means for bringing two (2) of said test boards standing in vertical condition in upper and lower positions with respect to said horizontal reference plane, into contact with or separate from said test heads, simultaneously.

11. A testing apparatus of IC devices, as defined in the claim 10, wherein said pre-heat portion is located in the upper position with respect to the horizontal reference plane.

12. A testing apparatus of IC devices, as defined in the claim 11, wherein said pre-heat portion includes a transit passage from said loader portion, in which said test boards are changed from the horizontal position into the vertical position, by position changing means.

13. A testing apparatus of IC devices, as defined in the claim 12, wherein in said testing/measuring portion is provided a mechanism for bringing the test board standing in vertical condition, which is transferred from said pre-heat portion, into the lower portion with respect to said horizontal reference plane, by virtue of gravity of weight of said test board.

14. A testing apparatus of IC devices, as defined in the claim 10, wherein said defroster portion is located in the lower position with respect to the horizontal reference plane.

15. A testing apparatus of IC devices, as defined in the claim 14, wherein said defroster portion includes a transit passage to said unloader portion , in which said test boards are change from the vertical position into the horizontal position on said the horizontal reference plane.

16. A testing apparatus of IC devices, as defined in the claim 10, wherein said test boards are circulated starting from said loader portion, passing through said testing/measuring portion, said defroster portion and said unloader portion, and back to said loader portion again.

17. A testing method of IC devices, comprising the following steps of:

loading a predetermined number of the IC devices on each of test boards transferred on a horizontal reference plane;

pre-heating the test boards being transferred on said horizontal plane from the above step so as to bringing the IC devices mounted thereon into a predetermined temperature condition;

testing/measuring electric properties of the IC devices mounted on the test boards, with standing at least two (2) of the test boards in vertical position in upper and lower positions with respect to the horizontal reference plane and bringing them in contact with test heads, simultaneously;

defrosting the test boards transferred from said above step for bringing the IC devices completed with testing/measuring thereon into other predetermined temperature condition; and unloading the IC devices from the test boards transferred on said horizontal reference plane from said above step, depending on test results obtained in said testing/measuring step.

18. A testing method of IC devices, as defined in the claim 17, wherein the test boards on which the IC devices are mounted are brought into the vertical standing condition when they are transfer into the step of said pre-heating, and are transferred into the step of said testing/measuring in the vertical standing condition thereof.

19. A testing method of IC devices, as defined in the claim 7, wherein in step of said testing/measuring, the test board is moved downward into the lower position with respect to said horizontal reference plane by virtue of gravity of weight of said test board.

20. A testing method of IC devices, as defined in the claim 17, wherein the test boards are changed from the vertical standing position into the horizontal position when they are transferred into the step of said unloading after being completed with the step of said defrosting.

* * * * *